(12) United States Patent
Bocian et al.

(10) Patent No.: US 8,529,996 B2
(45) Date of Patent: *Sep. 10, 2013

(54) HIGH-TEMPERATURE ATTACHMENT OF ORGANIC MOLECULES TO SUBSTRATES

(75) Inventors: David F. Bocian, Riverside, CA (US); Jonathan S. Lindsey, Raleigh, NC (US); Zhiming Liu, Riverside, CA (US); Amir A. Yasseri, Riverside, CA (US); Veena Misra, Raleigh, NC (US); Qian Zhao, Urbana, IL (US); Qiliang Li, Raleigh, NC (US); Shyam Surthi, Boise, ID (US); Robert S. Loewe, Morrisville, CA (US)

(73) Assignees: The Regents of the University of California, Oakland, CA (US); North Carolina State University, Raliegh, NC (US)

( * ) Notice: Subject to any disclaimer, the term of this patent is extended or adjusted under 35 U.S.C. 154(b) by 581 days.

This patent is subject to a terminal disclaimer.

(21) Appl. No.: 11/688,194

(22) Filed: Mar. 19, 2007

(65) Prior Publication Data

US 2007/0212897 A1     Sep. 13, 2007

Related U.S. Application Data

(63) Continuation of application No. 10/742,596, filed on Dec. 19, 2003, now Pat. No. 7,223,628, which is a continuation-in-part of application No. 10/628,868, filed on Jul. 28, 2003, now Pat. No. 6,943,054.

(60) Provisional application No. 60/489,992, filed on Jul. 25, 2003.

(51) Int. Cl.
 *C23C 16/00* (2006.01)

(52) U.S. Cl.
 USPC ....... 427/255.6; 427/248.1; 427/58; 427/96.8

(58) Field of Classification Search
 USPC ............................ 427/372.2, 384, 388.1, 331
 See application file for complete search history.

(56) References Cited

U.S. PATENT DOCUMENTS

| 6,060,327 A | 5/2000 | Keen |
| 6,178,034 B1 | 1/2001 | Allemand et al. |

(Continued)

FOREIGN PATENT DOCUMENTS

| WO | WO01-03126 | 1/2001 |
| WO | WO03/038886 | 5/2003 |
| WO | WO2005-043583 | 5/2005 |

OTHER PUBLICATIONS

Roth et al. Measurements of electron-transfer rates of charge-storage molecular monolayers on Si(100). Toward hybrid molecular/semiconductor information storage devices, J. Am. Chem. Soc., 125 (Jan. 2003) 505.*

(Continued)

*Primary Examiner* — David Turocy
(74) *Attorney, Agent, or Firm* — Tom Hunter; Weaver Austin Villeneuve & Sampson LLP

(57) ABSTRACT

This invention provides a new procedure for attaching molecules to semiconductor surfaces, in particular silicon. The molecules, which include, but are not limited to porphyrins and ferrocenes, have been previously shown to be attractive candidates for molecular-based information storage. The new attachment procedure is simple, can be completed in short times, requires minimal amounts of material, is compatible with diverse molecular functional groups, and in some instances affords unprecedented attachment motifs. These features greatly enhance the integration of the molecular materials into the processing steps that are needed to create hybrid molecular/semiconductor information storage devices.

35 Claims, 14 Drawing Sheets

(56) References Cited

U.S. PATENT DOCUMENTS

| | | | |
|---|---|---|---|
| 6,208,553 B1 | 3/2001 | Gryko et al. | |
| 6,212,093 B1 | 4/2001 | Lindsey | |
| 6,272,038 B1 | 8/2001 | Clausen et al. | |
| 6,316,098 B1 | 11/2001 | Yitzchaik et al. | |
| 6,324,091 B1 | 11/2001 | Gryko et al. | |
| 6,381,169 B1 | 4/2002 | Bocian et al. | |
| 6,407,330 B1 * | 6/2002 | Lindsey et al. | 136/263 |
| 6,420,648 B1 | 7/2002 | Lindsey et al. | |
| 6,451,942 B1 | 9/2002 | Li et al. | |
| 6,653,701 B1 | 11/2003 | Yamazaki et al. | |
| 6,657,884 B2 | 12/2003 | Bocian et al. | |
| 6,674,121 B2 | 1/2004 | Misra et al. | |
| 6,728,129 B2 | 4/2004 | Lindsey et al. | |
| 6,777,516 B2 | 8/2004 | Li et al. | |
| 6,824,837 B2 | 11/2004 | Abbott et al. | |
| 6,943,054 B2 * | 9/2005 | Bocian et al. | 438/99 |
| 7,223,628 B2 * | 5/2007 | Bocian et al. | 438/99 |
| 7,230,268 B2 | 6/2007 | Bocian et al. | |
| 7,348,206 B2 * | 3/2008 | Bocian et al. | 438/99 |
| 2003/0040173 A1 * | 2/2003 | Fonash et al. | 438/622 |
| 2003/0071949 A1 | 4/2003 | Abbott et al. | |
| 2003/0081463 A1 * | 5/2003 | Bocian et al. | 365/200 |
| 2003/0143581 A1 | 7/2003 | Franzen et al. | |
| 2004/0120180 A1 | 6/2004 | Rotenberg et al. | |
| 2004/0146863 A1 * | 7/2004 | Pisharody et al. | 435/6 |
| 2004/0183069 A1 | 9/2004 | Afzeli-Ardakani et al. | |
| 2004/0195688 A1 * | 10/2004 | Beck et al. | 257/751 |
| 2004/0241584 A1 | 12/2004 | Lindsey | |
| 2005/0119440 A1 | 6/2005 | Marks et al. | |
| 2005/0217559 A1 | 10/2005 | Bocian et al. | |
| 2006/0014013 A1 | 1/2006 | Saavedra et al. | |

OTHER PUBLICATIONS

Porier, G.E. et al. The Self-ssembly Mechanism of Alkanethiols on Au(111), Science, vol. 272, May 24, 1996, 1145-1148.*
Noh, Jaegeun et al. Molecular-scale growth processes of alkanethiol self-assembled monolayers on Au(111), Riken Review, No. 38, Aug. 2001, 49-51.*
US Office Action dated Oct. 27, 2005 issued in U.S. Appl. No. 10/742,596.
US Notice of Allowance dated Nov. 28, 2006 issued in U.S. Appl. No. 10/742,596.
US Office Action dated May 24, 2006 issued in U.S. Appl. No. 11/140,011.
US Notice of Allowance dated Feb. 9, 2007 issued in U.S. Appl. No. 11/140,011.
US Notice of Allowance dated Apr. 12, 2005 issued in U.S. Appl. No. 10/628,868.
PCT International Search Report dated Sep. 15, 2005 issued in WO2005043583.
PCT Preliminary Examination Report dated Jan. 30, 2006issued in WO2005043583.
PCT Written Opinion dated Sep. 15, 2005 issued in WO2005043583.
Bansal and Lewis (1998) *J. Phys. Chem.* 102: 1067-1070.
Bateman et al. (1998) *Angew. Chem. Int. Ed.*, 37: 2683-2685.
Bent (2002) *Surf Sci.*, 500: 879-903.
Bourkherroub and Wayner (1999) *J. Am. Chem. Soc.* 121: 11513-11515.
Buriak (2002) *J. Chem. Rev.*, 102, 1271-1308.
Buriak and Allen (1998) *J. Am. Chem. Soc.*, 120: 1339-1340.
Buriak et al. (1998) Lewis acid mediated functionalization of porous silicon with substituted alkenes and alynes, *J. Am. Chem. Soc.*, 120 (Jan. 1998) 1339.
Clausen et al. (2000) "Investigation of Tightly Coupled Porphrin Arrays Comprised of Identical Monomers for Multibit Information Storage." *Journal of Organic Chemistry*, 65: 73717378.
Cleland et al. (1995) *Faraday Commun.*, 91: 4001-4003.
Coulter et al. (2000) *J. Vac. Sci. Technol.* A 18: 1965-1970.
Li et al. (2002) *Appl. Phys. Lett.*, 81: 1494-1496.
Li et al. (2003) *Appl. Phys. Lett.*, 83: 198-200.
Liu et al. (2003) *Science*, 302: 1543-1545.
Liu et al. (2004) "Synthesis of Porphyrins Bearing Hydrocarbon Tethers and Facile Covalent Attachment to Si(100)." *Journal of Organic Chemistry*, 69: 5568-5577.
Perlovich et al. (2000) *J. Porphyrins Phthalocyanines* 4: 699-706.
Roth et al. (2002) Measurement of Electron-Transfer Rates of Charge-Storage Molecular Monolayers on Si(100). Toward Hybrid Molecular/Semiconductor Information Storage Devices *Journal of the American Chemistry Society*, 125(2): 505-517.
Roth et al. (2003)*Am. Chem. Soc.*, 125: 505-517.
Roth et al. (2000) Molecular approach toward information storage based on the redox properties of porphyrins in self-assembled monolayers, *J. Vac. Sci. TechnoL B*, 18 (Sep./Oct. 2000) 2359.
Semyannikov et al. (2000) *J. Porphyrins Phthalocyanines* 4: 271-277.
Song and Sailor (1999) *Comments on Inorganic Chemistry*, 21: 69-84.
Torres et al. (2002) *J. Chem. Thermodynamics*, 34: 293-302.
Zhu et al. (1999) *Langmuir* 15: 8147-8154.
Buriak, Julian (2002) "Organometallic Chemistry on Silicon and Germanium Surfaces" *Chemical Reviews* 102(5): 1271-1308.
Gryko et al. (2001) "Studies Related to the Design and Synthesis of a molecular Octal Counter" *J. Mater. Chem*, 11:1162-1180.
Hersam et al. (2000) "Silicon Based Molecular Nanotechnology," *Nanotechnology*, 11:70-76.
Jiang et al. (1998) "Heteroleptic triple-decker (phthalocyaninato)-(porphyrinato) europium(III) complexes: synthesis and electrochemical study" *Inorganica Chimica Acta*, 268:49-53.
JP Office Action dated May 24, 2012 issued in JP2006-521986.
JP Office Action dated Nov. 22, 2011 issued in JP2006-521986.
Mullins et al. (1993) "Adsorption and Reaction of Methanethiol on W(001)" *The Journal of Physical Chemistry* 93: 9226-9232.
Yamada et al. (1996) "Interaction of oxygen with alkali metals at the Ge(001) surface studied by metastable deexcitation spectostropy" *Surface Science*357-358: 481-485.
EP Supplementary Search Report dated Jun. 25, 2012 issued in EP04816786.0.

* cited by examiner

| Compound | X | Compound | X |
|---|---|---|---|
| 1 | -Br | 7 | -CH=CH$_2$ |
| 2 | -I | 8 | -CH$_2$CH=CH$_2$ |
| 3 | -OH | 9 | -CH$_2$SAc |
| 4 | -CHO | 10 | -CH$_2$SeAc |
| 5 | -CH$_2$Br | 11 | ethyne-H |
| 6 | -CH$_2$OH | 12 | ethyne-TMS |

HIGH-TEMPERATURE ATTACHMENT OF ORGANIC MOLECULES TO SUBSTRATES

CROSS-REFERENCE TO RELATED APPLICATIONS

This application is a Continuation of U.S. Ser. No. 10/742,596, filed on Dec. 19, 2003, now U.S. Pat. No. 7,223,628, which is a Continuation-in-Part of U.S. Ser. No. 10/628,868, filed on Jul. 28, 2003, now U.S. Pat. No. 6,943,054, which claims benefit of and priority to 60/489,992, filed on Jul. 25, 2003, all of which are incorporated herein by reference in their entirety for all purposes.

STATEMENT AS TO RIGHTS TO INVENTIONS MADE UNDER FEDERALLY SPONSORED RESEARCH AND DEVELOPMENT

This invention was made with Government support under Grant No. MDA972-01-C-0072 awarded by the Army. The Government has certain rights in this invention.

FIELD OF THE INVENTION

This invention pertains to the field of semiconductor fabrication. In particular this invention provides novel methods of coupling organic molecules to group III, IV, and V elements (e.g., silicon, germanium, etc.), and the like.

BACKGROUND OF THE INVENTION

The fabrication of ordered molecular assemblies on conducting silicon and other surfaces is of considerable interest owing to its potential applications in the microelectronic industry. One goal of semiconductor fabrication is to increase the density of active elements provided on an integrated circuit. In order to accomplish this, efforts have turned to the use of self-assembling molecular structures as an alternative to, or in conjunction with various lithographic processes to form the active elements used in integrated circuits.

In addition, interest has turned to the use of organic molecules to form such active elements (e.g., memory elements) (see, e.g., U.S. Pat. Nos. 6,272,038, 6,212,093, and 6,208,553, and PCT Publication WO 01/03126) and/or to form components of certain devices (e.g., field effect transistors, gates, sensors, transducers, etc.).

Organic molecules covalently attached to silicon are very stable due to the strength of Si—O and Si—C bonds. A number of approaches exist to form a covalent link between silicon and organic molecules (Buriak and Allen (1998) *J. Am. Chem. Soc.,* 120: 1339-1340; Bansal and Lewis (1998) *J. Phys. Chem.* 102: 1067-1070; Zhu et al. (1999) *Langmuir* 15: 8147-8154; Coulter et al. (2000) *J. Vac. Sci. Technol. A* 18: 1965-1970; Bourkherroub and Wayner (1999) *J. Am. Chem. Soc.* 121: 11513-11515; Cleland et al. (1995) *Faraday Commun.,* 91: 4001-4003; Bateman et al. (1998) *Angew. Chem. Int. Ed.,* 37: 2683-2685). These approaches include chemical, electrochemical and vapor deposition on a hydrogen-terminated silicon surface.

Such approaches, however, have typically involved difficult reaction conditions, have been relatively inefficient, have degraded the organic molecule(s), and/or have resulted in the production of fairly toxic materials.

SUMMARY OF THE INVENTION

This Invention provides a new procedure for attaching molecules to semiconductor surfaces, in particular silicon. The molecules include porphyrins and ferrocenes, which have been previously shown to be attractive candidates for molecular-based information storage. The new attachment procedure is simple, can be completed in short times, requires minimal amounts of material, is compatible with diverse molecular functional groups, and in some instances affords unprecedented attachment motifs. These features greatly enhance the integration of the molecular materials into the processing steps that are needed to create hybrid molecular/semiconductor information storage devices.

Thus, in one embodiment, this invention provides a method of covalently coupling an organic molecule to a surface of a Group II, III, IV, V, or VI element or to a semiconductor comprising a Group II, III, IV, V, or VI element (more preferably to a material comprising a Group III, IV, or V element or to a transition metal, transition metal oxide or nitride and/or to an alloy comprising a transition metal or to another metal.

Thus in certain embodiments, this invention provides method of coupling a redox-active molecule to a surface where the method includes providing one or more heat-resistant organic molecules bearing an attachment group; heating the molecule(s) or mixture of different molecules and/or the surface to a temperature of at least about 100° C.; and contacting the molecule(s) to the surface whereby the molecule(s) form a covalent linkage to the surface. In certain embodiments, the organic molecule(s) are electrically coupled to the surface. The method can, optionally, be performed under an inert atmosphere (e.g. $Ar_2$). In certain embodiments, the heating comprises heating the molecule(s) to a gas phase and the contacting comprises contacting the gas phase to the surface. In certain embodiments, the heating comprises heating the molecule(s) and/or the surface while the molecule is in contact with the surface. In certain embodiments, the heating comprises applying the molecule(s) to the surface and then simultaneously or subsequently heating the molecule(s) and/or surface. The organic molecule(s) can be provided in a solvent or dry, or in gas phase, or otherwise not in a solvent.

In certain embodiments, the heating is to a temperature of at least about 100° C., preferably at least about 200° C., more preferably at least about 300° C., and most preferably at least about 400° C. Heating can be accomplished by any convenient method, e.g. in a in a CVD device, in an MBE device, etc. In certain embodiments, the surface comprises a material selected from the group consisting of a Group III element, a Group IV element, a Group V element, a semiconductor comprising a Group III element, a semiconductor comprising a Group IV element, a semiconductor comprising a Group V element, a transition metal, and a transition metal oxide. Certain preferred surfaces comprise one or more of the following: tungsten, tantalum, and niobium Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, Mo, and oxides, alloys, mixtures, and/or nitrides thereof. In certain embodiments, the surface comprises a Group III, IV, or V, and/or a doped Group III, IV, or V element, e.g. silicon, germanium, doped silicon, doped germanium, and the like. The surface can, optionally, be a hydrogen passivated surface. In certain embodiments, the heat-resistant molecule is a redox-active molecule selected from the group consisting of a porphyrin, a porphyrinic macrocycle, an expanded porphyrin, a contracted porphyrin, a linear porphyrin polymer, a porphyrinic sandwich coordination complex, and a porphyrin array. Certain preferred redox-active molecules comprise a porphyrinic macrocycle substituted at a β-position or at a meso-position. Certain preferred redox-active molecules comprise a porphyrinic macrocycle containing at least two porphyrins of equal energies held apart from each other at a spacing less than about 50 Å such that the molecule has an even or an odd hole oxidation where the hole hops between the two porphyrins, and where the odd hole oxidation state is different from and distinguishable from another oxidation state of the porphyrinic macrocycle.

In certain embodiments, the attachment group comprises an aryl functional group and/or an alkyl attachment group. In certain embodiments, the aryl functional group comprises a functional group selected from the group consisting of bromo, iodo, hydroxy, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. In certain embodiments, the alkyl attachment group comprises a functional group selected from the group consisting of bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl. In certain embodiments, the attachment group comprises an alcohol or a phosphonate. In certain preferred embodiments, the attachment group is selected from the group consisting of 4-(hydroxymethyl)phenyl, 4-(S-acetylthiomethyl)phenyl, 4-(Se-acetylselenomethyl)phenyl, 4-(mercaptomethyl)phenyl, 4-(hydroselenomethyl)phenyl, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-hydroxyphenyl, 4-(4,4,5,5-tetramethyl-1,3,2-dioxaborolan-2-yl)phenyl bromo, iodo, hydroxymethyl, S-acetylthiomethyl, Se-acetylselenomethyl, mercaptomethyl, hydroselenomethyl, formyl, bromomethyl, chloromethyl, ethynyl, vinyl, allyl, 4-[2-(4-(hydroxymethyl)phenyl)ethynyl]phenyl, 4-(ethynyl)biphen-4'-yl, 4-[2-(triisopropylsilyl)ethynyl]biphen-4'-yl, 3,5-diethynylphenyl, and 2-bromoethyl. In certain embodiments, the heat-resistant organic molecule bearing an attachment group is selected from the group consisting of 5-[4-(S-acetylthiomethyl)phenyl]-10,15,20-trimesitylporphinatozinc(II), 5-[4-(mercaptomethyl)phenyl]-10,15,20-trimesitylporphinatozinc(II), 5-[4-(hydroxymethyl)phenyl]-10,15,20-trimesitylporphinatozinc(II), 5-[4-(hydroxymethyl)phenyl]-10,15,20-tri-p-tolylporphinatozinc(II), 5-(4-allylphenyl)-10,15,20-trimesitylporphinatozinc (II), 5-(4-formylphenyl)-15-phenyl-10,20-di-p-tolylporphinatozinc(II), 5-(4-bromomethylphenyl)-10,15,20-trimesitylporphinatozinc(II), 5-(4-ethynylphenyl)-10,15,20-trimesitylporphinatozinc(II), 5-(4-iodophenyl)-10,15,20-trimesitylporphinatozinc(II), 5-(4-bromophenyl)-10,15,20-tri-p-tolylporphinatozinc(II), 5-(4-hydroxyphenyl)-10,15,20-trimesitylporphinatozinc(II), 5,10-bis(4-ethynylphenyl)-15,20-dimesitylporphinatozinc(II), 5-[4-(4,4,5,5-tetramethyl-1,3,2-dioxaborolan-2-yl)phenyl]-10,20-bis(3,5-di-tert-butylphenyl)-15-mesitylporphinatozinc(II), 5-iodo-10,20-bis(3,5-di-tert-butylphenyl)-15-mesitylporphinatozinc(II), 5,10-bis(4-iodophenyl)-15,20-dimesitylporphinatozinc(II), 5-[4-(2-(trimethylsilyl)ethynyl)phenyl]-10,15,20-trimesitylporphinatozinc(II), 5,15-bis(4-ethynylphenyl)-10,20-dimesitylporphinatozinc(II), 5,15-bis(4-iodophenyl)-10,20-dimesitylporphinatozinc(II), 5,10,15-tris(4-ethynylphenyl)-20-mesitylporphinatozinc(II), 5,15-bis(4-ethynylphenyl)-10,20-bis(4-tert-butylphenyl)porphinatozinc(II), 5,15-bis(4-ethynylphenyl)porphinatozinc(II), 5,15-bis(3-ethynylphenyl)-10,20-dimesitylporphinatozinc(II), 5,10,15,20-tetrakis(4-ethynylphenyl)porphinatozinc(II), 5,10-bis[4-(2-(trimethylsilyl)ethynyl)phenyl]-15,20-dimesitylporphinatozinc(II), 5-(3,5-diethynylphenyl)-10,15,20-trimesitylporphinatozinc(II), 3,7-dibromo-10,20-bis(3,5-di-tert-butylphenyl)-15-mesitylporphinatozinc(II), 5-[4-(2-(trimethylsilyl)ethynyl)phenyl]-10,15,20-tri-p-tolylporphinatozinc(II), 5-[4-(Se-acetylselenomethyl)phenyl]-10,15,20-trimesitylporphinatozinc(II), 5-(4-iodophenyl)-10,20-bis(3,5-di-tert-butylphenyl)-15-mesitylporphinatozinc(II), 5,10-bis(4-ethynylphenyl)-15,20-bis(4-tert-butylphenyl)porphinatozinc(II), 5,10-bis(4-ethynylbiphen-4'-yl)-15,20-bis(4-tert-butylphenyl)porphinatozinc(II), 5-(4-vinylphenyl)-10,15,20-trimesitylporphinatozinc(II), 5-(4-vinylphenyl)-10,15,20-tri-p-tolylporphinatozinc(II), 5-(hydroxymethyl)-10,15,20-trimesitylporphinatozinc(II), 5-(4-allylphenyl)-10,15,20-tri-p-tolylporphinatozinc(II), 5-(4-allylphenyl)-10,15,20-tri-p-tolylporphinatocopper(II), type c triple decker[(tert-butyl)$_4$phthalocyaninato]Eu[(tert-butyl)$_4$phthalocyaninato]Eu[5,15-bis(4-ethynylphenyl)-10,20-bis(4-tert-butylphenyl)porphyrin], type c triple decker[(tert-butyl)$_4$phthalocyaninato]Eu[(tert-butyl)$_4$phthalocyaninato]Eu[5-[4-[2-(4-(hydroxymethyl)phenyl)ethynyl]phenyl]-10,15,20-tri-p-tolylporphyrin], 5,10-bis[4-(2-(triisopropylsilyl)ethynyl)biphen-4'-yl]-15,20-bis(4-tert-butylphenyl)porphinatozinc (II), and 5,10-bis[4-(2-(triisopropylsilyl)ethynyl)phenyl]-15,20-bis(4-tert-butylphenyl)porphinatozinc(II).

In certain embodiments, the contacting comprises selectively contacting the organic molecule to certain regions of the surface and not to other regions. For example, the contacting can comprises selectively contacting the volatilized organic molecule to certain regions of the surface and not to other regions. In certain embodiments, the contacting comprises placing a protective coating (e.g. a making material) on the surface in regions where the organic molecule(s) are not to be attached; contacting the molecule(s) with the surface; and removing the protective coating to provide regions of the surface without the organic molecule(s). In certain embodiments, the contacting comprises contact printing of a solution comprising the organic molecule(s) or the dry organic molecule(s) onto the surface. In certain embodiments, the contacting comprises spraying or dropping a solution comprising the organic molecule(s) or applying the dry organic molecule(s) onto the surface. In certain embodiments, the contacting comprises contacting the surface with the molecule(s) and subsequently etching selected regions of the surface to remove the organic molecule(s). In certain embodiments, the contacting comprises molecular beam epitaxy (MBE), and/or chemical vapor deposition (CVD), and/or plasma-assisted vapor deposition, and/or sputtering and the like. In certain embodiments, the heat-resistant organic molecule comprises a mixture at least two different species of heat-resistant organic molecule and the heating comprises heating the mixture and/or the surface.

This invention also provides a method of coupling a redox-active molecule (or a collection of different species of redox-active molecules) to a surface. The method typically involves heating the molecule(s) to a gas phase; and contacting the molecule(s) to a surface whereby the redox-active molecule(s) couple to the surface. In certain embodiments, the redox-active molecule is covalently coupled to the surface and/or electrically coupled to the surface. In certain embodiments, the heating is to a temperature of at least about 100° C., preferably at least about 200° C., more preferably at least about 300° C., and most preferably at least about 400° C. Heating can be accomplished by any convenient method, e.g. in a in a CVD device, in an MBE device, etc.

In certain embodiments, the surface can comprise a material selected from the group consisting of a Group III element, a Group IV element, a Group V element, a semiconductor comprising a Group III element, a semiconductor comprising a Group IV element, a semiconductor comprising a Group V element, a transition metal, a transition metal oxide, and another metal, e.g. as described above. In certain embodiments, the surface comprises a material such as tungsten, tantalum, niobium, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, Mo, and/or oxides, nitrides, mixtures, or alloys thereof. In certain embodiments, the redox-active molecule includes, but is not limited to any of the molecules described herein. Similarly the attachment groups include, but are not limited to any of the attachment groups described herein. In certain embodiments, the Group II, III, IV, V, or VI element, more preferably a Group III, IV, or V, element, still more preferably a Group IV element or a doped Group IV element (e.g., silicon, germanium, doped silicon, doped germanium, etc.). In certain embodiments, the contacting comprises selectively contacting the volatilized organic molecule to certain regions of the surface and not to other regions. In certain embodiments, the contacting comprises: placing a protective coating on the surface in regions where the redox-active molecule is not to be attached; contacting the molecule with the surface; and removing the protective coating to provide regions of the surface without the redox-active molecule. In certain embodiments, the contacting comprises contacting the surface with a the molecule and subsequently etching selected regions of the surface to remove the redox-active molecule. In certain embodiments, the contacting comprises molecular beam epitaxy (MBE), and/or chemical vapor deposition (CVD), and/or plasma-assisted vapor deposition, and/or sputtering.

In another embodiment, this invention provides a surface of a Group II, III, IV, V, or VI element or a surface of a semiconductor comprising a Group II, III, IV, V, or VI or a transition metal, transition metal oxide, or nitride, or alloy, or mixture having an organic molecule coupled thereto through a covalent bond, where the organic molecule is coupled to said surface by methods described herein. In certain embodiments, the organic molecule is a redox-active molecule and includes, but is not limited to any of the molecules described herein. Similarly the attachment groups include, but are not limited to any of the attachment groups described herein. In certain embodiments, the Group II, III, IV, V, or VI element, more preferably a Group III, IV, or V, element, still more preferably a Group IV element or a doped Group IV element (e.g., silicon, germanium, doped silicon, doped germanium, etc.). In certain embodiments, the surface comprises a surface in a transistor and/or a surface in a memory element. In certain embodiments, the surface comprises a plurality of memory elements and/or one or more integrated circuit elements (e.g., a diode, a logic gate, and a rectifier). In certain embodiments, the surface comprises a redox-active molecule and the surface is is electrically coupled to a device that reads and/or sets the oxidation state of that molecule e.g. a voltammetric device, an "amperometric device, a potentiometric device, a coulometric device, an impedance spectrometer, etc. In certain embodiments, the device comprises a sinusoidal voltammeter.

In another embodiment, this invention provides a method of fabricating an ordered molecular assembly. The method typically involves providing a heat-resistant organic molecule (or a plurality of different heat resistant organic molecules) derivatized with an attachment group; heating the molecule and/or a surface to a temperature of at least about 100° C.; where the surface comprises a Group III, IV, or V element or a transition metal or metal oxide, contacting the molecule(s) at a plurality of discrete locations on the surface whereby the attachment groups form covalent or ionic bonds with the surface at the plurality of discrete locations. In certain embodiments, the heating is to a temperature of at least about 100° C., preferably at least about 200° C., more preferably at least about 300° C., and most preferably at least about 400° C. In certain embodiments, the organic molecule is a redox-active molecule and includes, but is not limited to any of the molecules described herein. Similarly the attachment groups include, but are not limited to any of the attachment groups described herein. In certain embodiments, the Group II, III, IV, V, or VI element, more preferably a Group III, IV, or V, element, still more preferably a Group IV element or a doped Group IV element (e.g., silicon, germanium, doped silicon, doped germanium, etc.).

This invention also provide kits for coupling an organic molecule to the surface of a type III, IV, or V material or a transition metal or transition metal oxide. The kits typically include a container containing a heat-resistant organic molecule derivatized with an attachment group (e.g., as described herein) and, optionally instructional materials teaching coupling the organic molecule to the surface by heating the molecule and/or the surface to a temperature of about 200° C. or more.

DEFINITIONS

The term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{2+}(aq) \rightarrow Fe^{3+}(aq) + e^-$ because electrons are lost from the species being oxidized, $Fe^{2+}(aq)$, despite the apparent production of electrons as "free" entities in oxidation reactions. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

The term "multiple oxidation states" means more than one oxidation state. In preferred embodiments, the oxidation states may reflect the gain of electrons (reduction) or the loss of electrons (oxidation).

The terms "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g., 0° C. to about 40° C.).

The term "tightly coupled" when used in reference to a subunit of a multi-subunit (e.g., polymeric) storage molecule of this invention refers to positioning of the subunits relative to each other such that oxidation of one subunit alters the oxidation potential(s) of the other subunit. In a preferred embodiment the alteration is sufficient such that the (non-neutral) oxidation state(s) of the second subunit are different and distinguishable from the non-neutral oxidation states of the first subunit. In a preferred embodiment the tight coupling is achieved by a covalent bond (e.g., single, double, triple, etc.). However, in certain embodiments, the tight coupling can be through a linker, via an ionic interaction, via a hydrophobic interaction, through coordination of a metal, or by simple mechanical juxtaposition. It is understood that the subunits could be so tightly coupled that the redox processes are those of a single supermolecule.

The term "electrode" refers to any medium capable of transporting charge (e.g., electrons) to and/or from a storage molecule. Preferred electrodes are metals or conductive organic molecules. The electrodes can be manufactured to virtually any 2-dimensional or 3-dimensional shape (e.g., discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g., a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The term "reference electrode" is used to refer to one or more electrodes that provide a reference (e.g., a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g., via a linker), direct or indirect ionic bonding between the storage medium/molecule and the electrode, or other bonding (e.g., hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The term "redox-active unit" or "redox-active subunit" refers to a molecule or component of a molecule that is capable of being oxidized or reduced by the application of a suitable voltage.

The term "redox-active" molecule refers to a molecule or component of a molecule that is capable of being oxidized or reduced by the application of a suitable voltage.

The term "subunit", as used herein, refers to a redox-active component of a molecule.

The term "electrochemical cell" typically refers to a reference electrode, a working electrode, a redox-active molecule (e.g., a storage medium), and, if necessary, some means (e.g., a dielectric) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g., a working electrode and a reference electrode). The storage cells can be individually addressed (e.g., a unique electrode is associated with each memory element) or, particularly where the oxidation states of different memory elements are distinguishable, multiple memory elements can be addressed by a single electrode. The memory element can optionally include a dielectric (e.g., a dielectric impregnated with counterions).

The term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

"Addressing" a particular element refers to associating (e.g., electrically coupling) that memory element with an electrode such that the electrode can be used to specifically determine the oxidation state(s) of that memory element.

The terms "read" or "interrogate" refer to the determination of the oxidation state(s) of one or more molecules (e.g., molecules comprising a storage medium).

The phrase "output of an integrated circuit" refers to a voltage or signal produced by a one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific potential field potential ("voltage").

A "potentiometric device" is a device capable of measuring potential across an interface that results from a difference in the equilibrium concentrations of redox molecules in an electrochemical cell.

A "coulometric device" is a device capable of the net charge produced during the application of a potential field ("voltage") to an electrochemical cell.

An "impedance spectrometer" is a device capable of determining the overall impedance of an electrochemical cell.

A "sinusoidal voltammeter" is a voltammetric device capable of determining the frequency domain properties of an electrochemical cell.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g., phthalocyanines, sub-phthalocyanines, and porphyrin isomers). Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched.

The terms "sandwich coordination compound" or "sandwich coordination complex" refer to a compound of the formula $L^nM^{n-1}$, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) *Chemical Society Reviews* 26: 433-442). Sandwich coordination complexes include, but are not limited to "double-decker sandwich coordination compound" and "triple-decker sandwich coordination compounds". The synthesis and use of sandwich coordination compounds is described in detail in U.S. Pat. No. 6,212,093B1.

The term "double-decker sandwich coordination compound" refers to a sandwich coordination compound as described above where n is 2, thus having the formula $L^1$-$M^1$-$L^2$, wherein each of $L^1$ and $L^2$ may be the same or different (see, e.g., Jiang et al. (1999) *J. Porphyrins Phthalocyanines* 3: 322-328).

The term "triple-decker sandwich coordination compound" refers to a sandwich coordination compound as described above where n is 3, thus having the formula $L^1$-$M^1$-$L^2$-$M^2$-$L^3$, wherein each of $L^1$, $L^2$ and $L^3$ may be the same or different, and $M^1$ and $M^2$ may be the same or different (see, e.g., Arnold et al. (1999) *Chemistry Letters* 483-484).

A "linker" is a molecule used to couple two different molecules, two subunits of a molecule, or a molecule to a substrate.

A "substrate" is a, preferably solid, material suitable for the attachment of one or more molecules. Substrates can be formed of materials including, but not limited to glass, plastic, silicon, germanium, minerals (e.g., quartz), semiconducting materials (e.g., doped silicon, doped germanium, etc.), ceramics, metals, etc.

In preferred embodiments, when a metal is designated by "M" or "M'", where n is an integer, it is recognized that the metal may be associated with a counterion.

A "group II, III, IV, V, or VI element or material" includes the pure element, a doped variant of the group II, III, IV, V, or VI element and/or an oxidized variant of the group II, III, IV, V or VI element.

The term "heat-resistant organic molecule" or "heat-stable organic molecule" refers to organic molecules (e.g., porphyrins) that are stable (e.g., show no decomposition, or substantially no decomposition) at temperature of 200° C. to 400° C., preferably at 400° C. for at least 30 seconds, preferably for at least one minute, more preferably for at least 2 to 5 minutes.

A "group III, IV, or V substrate" is a material comprising a Group III, IV, or V element.

The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, and/or oxides, and/or nitrides, and/or alloys, and/or mixtures thereof.

A "a solution comprising a heat-resistant organic molecule" is not limited to a true solution, but also includes suspensions, dispersions, and emulsions thereof. In addition, the solution contemplates pastes, gels, aerogels, and essentially any medium suitable for "containing" the heat-resistant organic molecule(s).

A "molecule bearing an attachment group" includes molecules where the attachment group is an intrinsic component of the molecule, molecules derivatized to add an attachment group, and molecules derivatized so they bear a linker comprising an attachment group.

The phrase "heating a molecule" includes heating collections of molecules and/or increasing the kinetic energy of a single molecule.

BRIEF DESCRIPTION OF THE DRAWINGS

FIG. 6A shows the cyclic voltammetric behavior of a porphyrin monolayer tethered to Si(100) via a Si—O—C linkage, while

DETAILED DESCRIPTION

I. Coupling an Organic Molecule to a Substrate.

Figure 1:
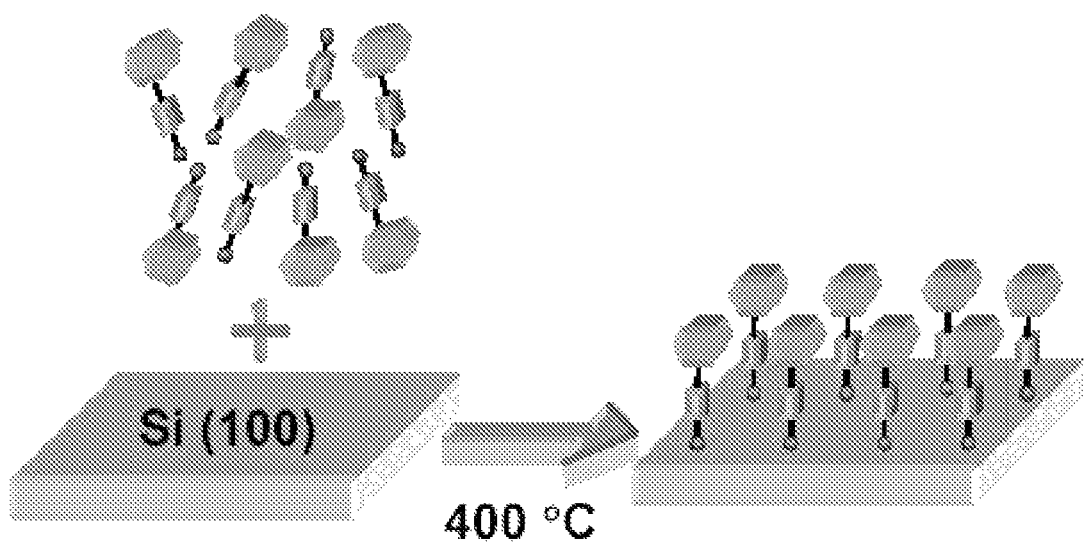
FIG. 1 schematically illustrates the attachment of a heat-resistant organic molecule to a substrate according to a method of this invention.

This invention pertains to a novel approach to covalently attach organic molecules to a surface of a type II, III, IV, V, or VI material, a doped variant thereof and/or an oxide thereof and/or to a transition metal and/or transition metal oxide or nitride. In certain embodiments (see, e.g., FIG. 1), the method involves: providing a heat-resistant organic molecule bearing an attachment group (e.g. comprising an attachment group or derivatized with an attachment group or linker bearing an attachment group); and contacting the molecule to the surface at an elevated temperature (e.g. at least about 200° C., preferably at least about 300° C., and more preferably at least about 400° C.). It was a surprising discovery that heat-resistant organic molecules, particularly redox-active heat-resistant organic molecules (e.g. porphyrinic macrocycles) will form an effective bond (e.g., a covalent bond) with the surface under such conditions.

In addition, it was a particularly surprising discovery that redox-active molecules so attached, remain stable and can sustain setting and resetting of their oxidation states through many thousands and even millions of cycles.

In various embodiments, the molecule(s) (e.g. a single species of heat-resistant molecule or mixtures of different species of heat-resistant molecules) can be heated and contacted to the surface, and/or the surface can be heated, and/or both the molecule(s) and the surface can be heated. In addition the surface and/or the molecule(s) can be heated prior to contacting each other and/or while they are in contact.

In certain embodiments, the heat-resistant organic molecule is dissolved in an organic solvent (e.g., THF, mesitylene, durene, o-dichlorobenzene, 1,2,4-trichlorobenzene, 1-chloronaphthalene, 2-chloronaphthalene, N,N-dimethylformamide, N,N-dimethylacetamide, N,N-dimethylpropionamide, benzonitrile, anisole, and the like). The solvent containing the molecule can then be applied to the surface. Heating can be accomplished by any of a variety of conventional methods. For example, the solvent can be heated before application to the surface. In certain embodiments, both the solvent and the surface can be heated before the solvent is applied to the surface. In certain preferred embodiments, the surface is heated after application of the solvent. This is conveniently accomplished by baking the surface (e.g., in an oven). In certain preferred embodiments, the surface is heated (e.g., baked) under an inert atmosphere (e.g., argon or other inert gas(es)).

In certain embodiments, particularly where large size wafers (e.g. over 12 inches in diameter) are used for manufacture, solvent free methods of the present invention are utilized. In the solvent-free methods, SAMs of electro-active molecules (e.g. redox-active molecules like ferrocene and porphyrin), or other heat-resistant molecules are formed on desired surface (e.g. silicon, silicon dioxide, metals, metal oxides metal nitrides, etc.) without the use of any solvents. In other words, the attachment can be performed in a completely dry environment. In various embodiments, this process converts the solid phase molecules to gas phase by heating them at appropriate temperatures and then transporting the gas phase molecules to the desired surface. This process also enables separate control of the molecule and substrate temperature which can assist in achieving maximum attachment density. This process can be easily applied in production since similar techniques (e.g. CVD and MBE) are already in use for depositing materials in the semiconductor industry.

Figure 7:
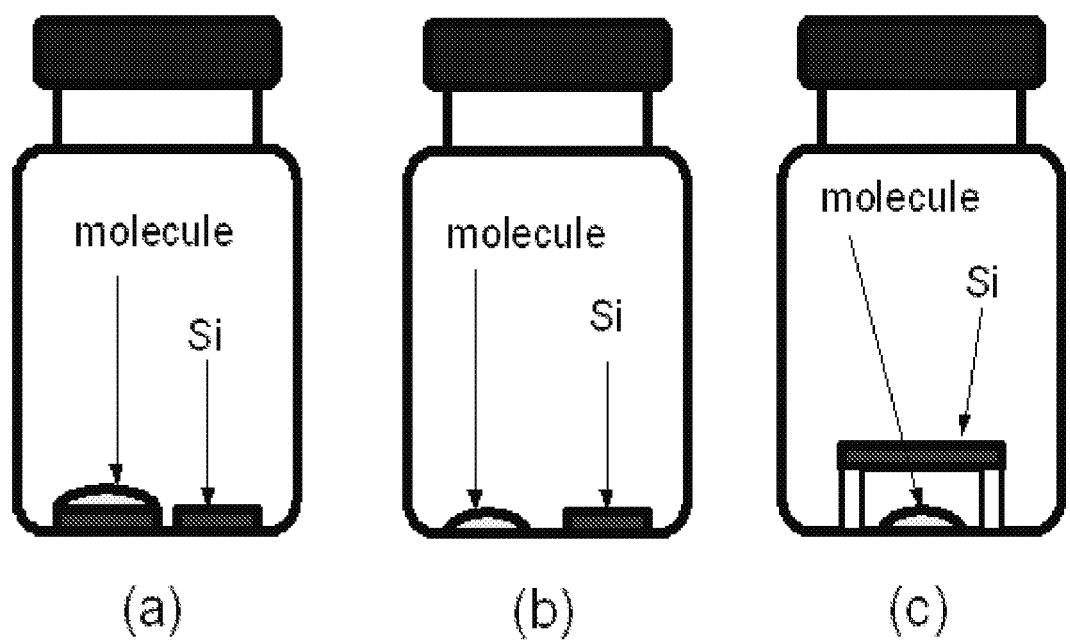
FIG. 7 illustrates several basic approaches to solvent-free attachment of organic molecules to substrates.

Several basic approaches to solvent-free attachment are illustrated in FIG. 7. In one approach, the heat-resistant molecule (or mixture of molecules) is deposited in a chamber containing the substrate (e.g. a Group III, IV, or V element, a transition metal, a transition metal oxide or nitride, etc.). The solvent is evaporated away leaving only the heat-resistant molecule. The chamber is then heated volatilizing the molecule which then contacts and couples to the substrate surface.

In another approach illustrated in FIG. 7, the molecule is placed in the chamber as a dry powder. Again the chamber is heated volatilizing the molecule which then contacts and couples to the substrate surface.

In certain embodiments, the molecules to be coupled to the surface are deposited directly on the surface (e.g. in a dry form or in a solvent which is then evaporated away). The molecule and/or surface is then heated (e.g. to 200° C. or more) and the molecule couples to the surface (e.g. via an ionic, more preferably via a covalent bond).

Figure 2:
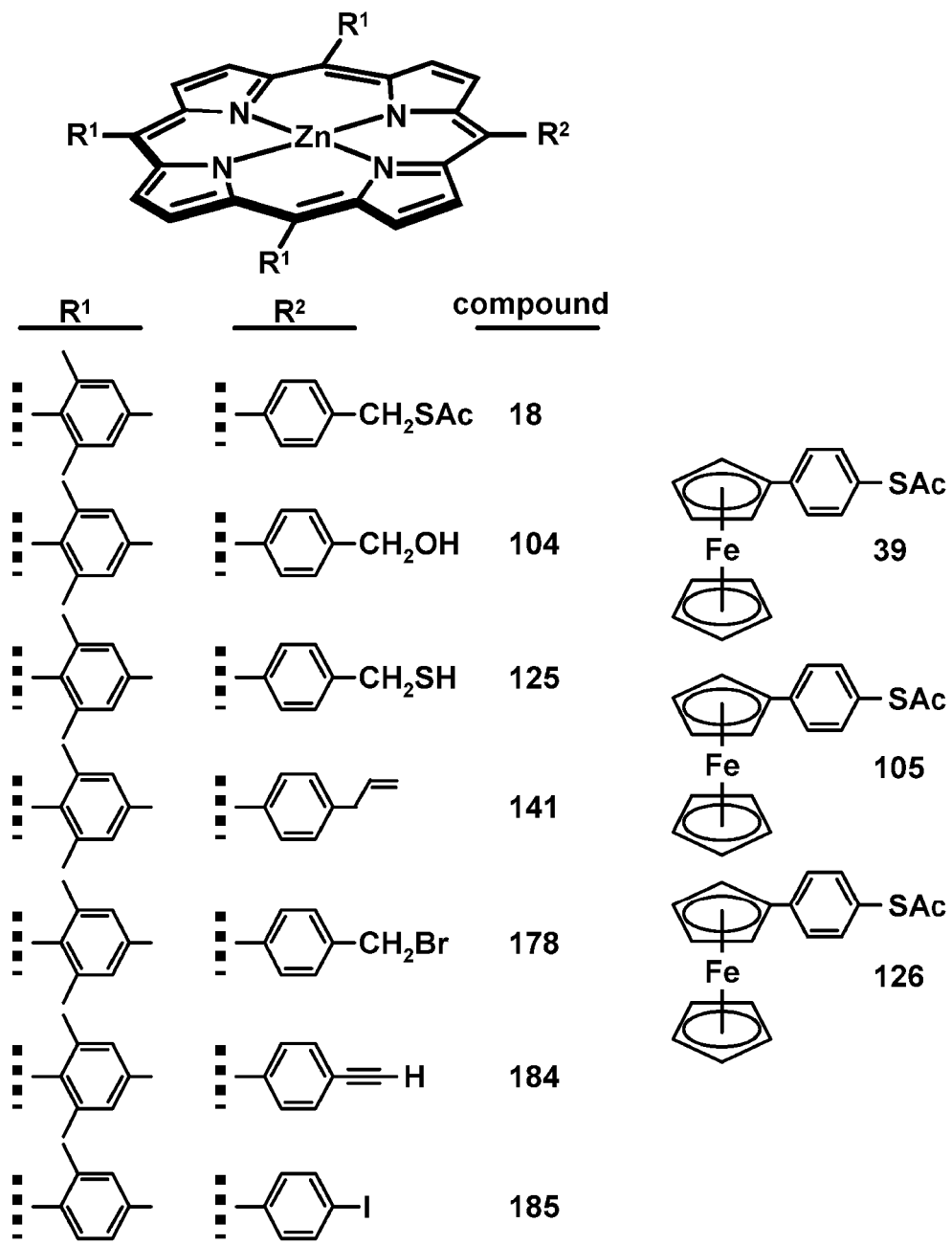
FIG. 2 shows illustrative heat-resistant organic molecules for use in the methods of this invention.
Figure 2:
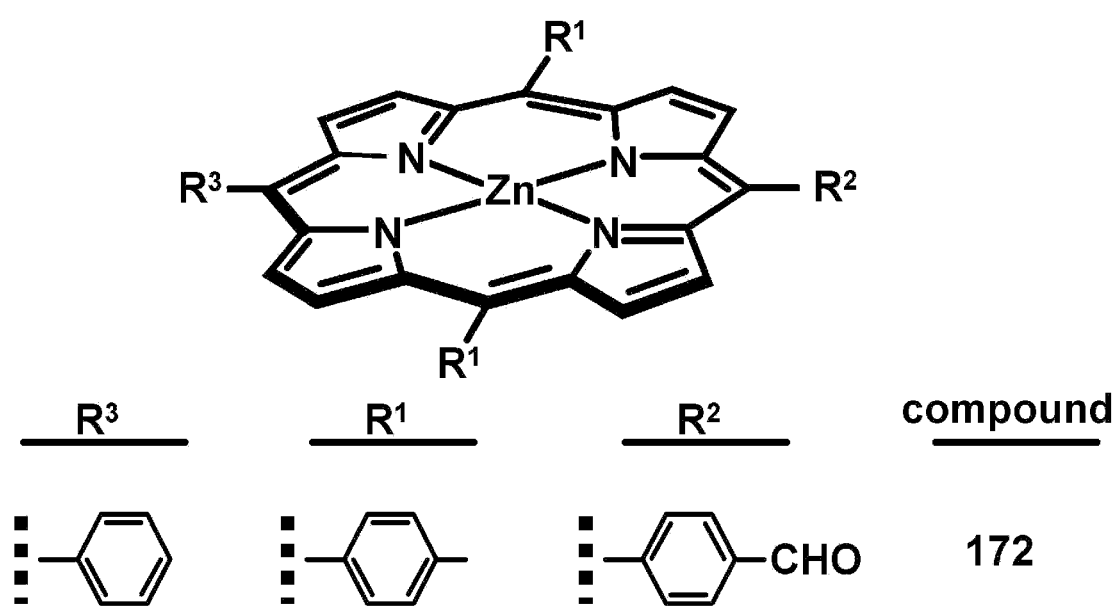
Figure 3:
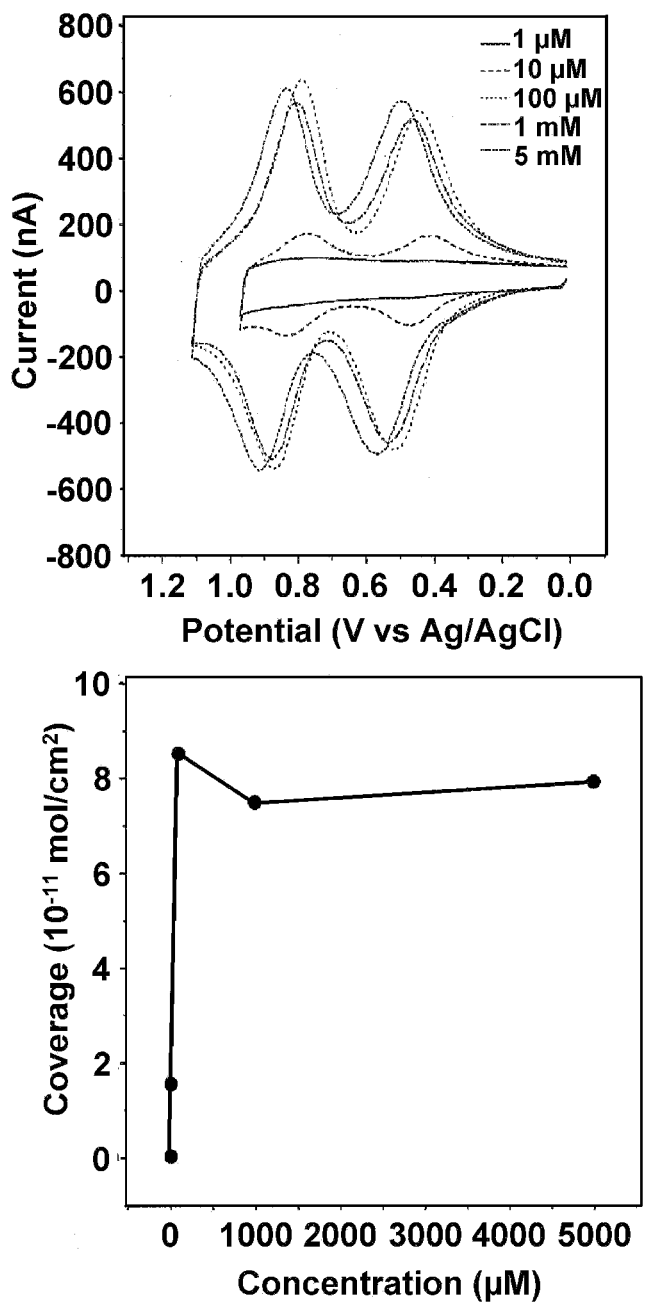
FIG. 3 illustrates the optimization of concentration of porphyrin alcohol (porphyrin-OH) in THF for attachment of the porphyrin to patterned Si—H surfaces.
Figure 4:
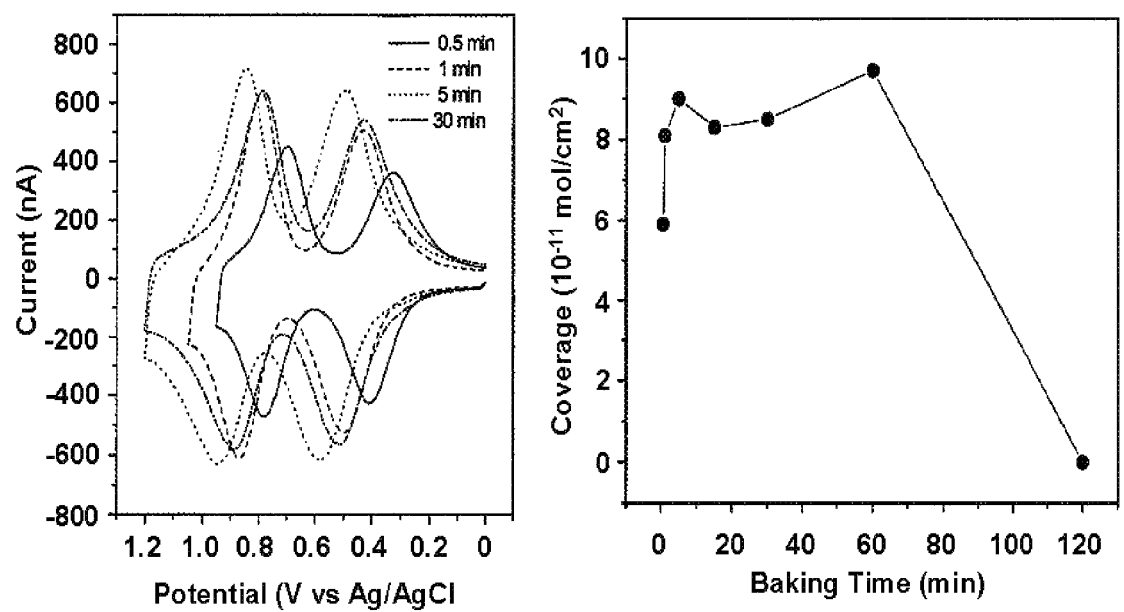
FIG. 4 illustrates the effect of baking time of attachment of porphyrin-OH (compound 104) on Si—H using casting and baking process. Other conditions: 400° C., 1 mM in THF, 100 V/s.
Figure 5:
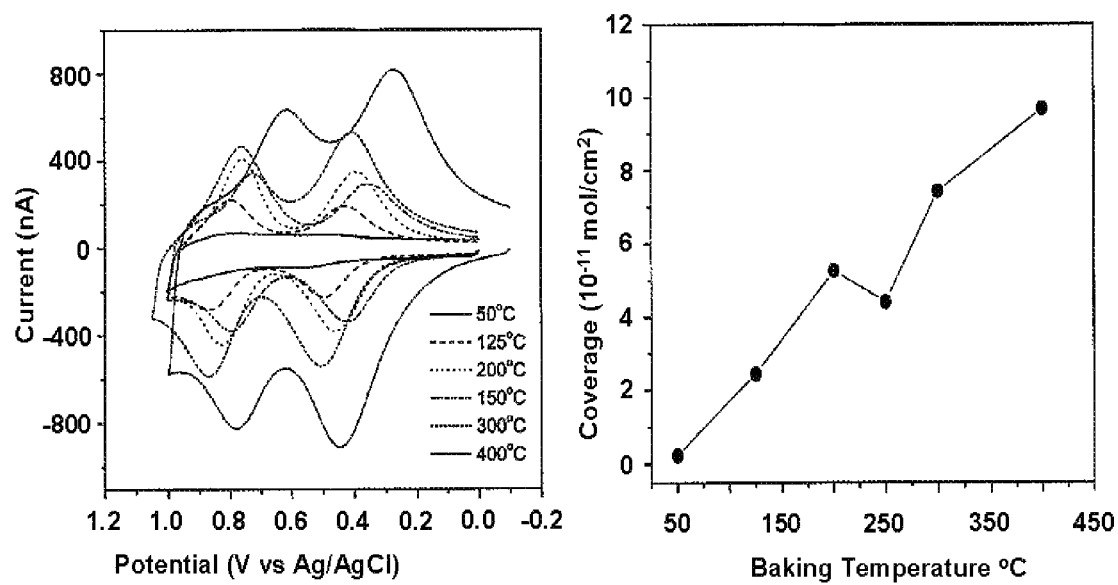
FIG. 5 illustrates the optimization of baking temperature for attaching porphyrin alcohol (porphyrin-OH) to patterned Si—H surfaces. Other conditions: 1 mM in THF, 60 minutes, 100 V/s.

Various parameters can be optimized for attachment of any particular organic molecule. These include (1) the concentration of the molecule(s), (2) the baking time, and (3) the baking temperature. FIGS. 3, 4, and 5 show the results of these studies for a representative porphyrin (molecule 104 in FIG. 2). In each figure, the left panel shows the cyclic voltammogram of the covalently attached molecule. The characteristic features of the voltammograms are indicative of covalent attachment and robust electrochemical behavior (see, e.g., Li et al. (2002 *Appl. Phys. Lett.* 81: 1494-1496; Roth et al. (2003) *J. Am. Chem. Soc.* 125: 505-517). The right panel shows the molecular coverage. Saturating coverage for this type of molecule is in the range of $10^{-10}$ mol $cm^{-2}$. Although the three parameters above are not independent, the figures illustrate the following key observations. First, using the methods described herein, the molecules can be attached at relatively high surface coverage (in the range of $5\times10^{-11}$ mol $cm^{-2}$) using micromolar concentrations of materials (see, e.g., FIG. 3). Facile attachment using extremely small amounts of material (e.g., concentration less than about 5 mM, preferably less than about 1 mM, more preferably less than about 500 μM or 100 μM, still more preferably less than about 10 μM, and most preferably less than about 1 μM) is distinctly different from other procedures that have been used to anchor molecules to silicon. These procedures typically use very high concentrations of molecules in solution or neat molecules. The use of very small amounts of material indicates that a few grams of information storage molecules could be used to make millions of chips. The use of small amounts of material also indicates that relatively small amounts of organic solvents can be used, thereby minimizing environmental hazards.

In addition, it was a surprising discovery that baking times as short as a few minutes (e.g., typically from about 1 sec to about 1 hr, preferably from about 10 sec to about 30 min, more preferably from about 1 minute to about 5, 10, or 15 minutes, and most preferably from about 30 sec to about 1 or 2 minutes) afford high surface coverage (FIG. 4). Short times minimize the amount of energy that is used in the processing step.

It was also a surprising discovery that baking temperatures as high as 400° C. can be used with no degradation of the molecules (FIG. 5). This result is of importance in that many processing steps in fabricating CMOS devices entail high temperature processing. In certain embodiments, preferred baking temperatures range from about 125° C. to about 400° C., preferably from about 200° C. to about 400° C., more preferably from about 250° C. to about 400° C., and most preferably from about 300° C. to about 400° C.

A further significant point is that diverse functional groups on the information storage molecules are suitable for use in attachment to silicon or other substrates (e.g. Group III, IV, or V elements, transition metals, transition metal oxides or nitrides, transition metal alloys, etc.). The groups include, but are not limited to, alcohol, thiol, S-acetylthiol, bromomethyl, allyl, iodoaryl, carboxaldehyde, ethyne, vinyl, hydroxymethyl. It is also noted that such groups such as ethyl, methyl, or arene afforded essentially no attachment as demonstrated by the failure to achieve substantial attachment with the zinc chelates of octaethylporphyrin, meso-tetraphenylporphyrin, meso-tetra-p-tolylporphyrin, and meso-tetramesitylporphyrin.

The successful attachment via S-acetylthiol, bromomethyl, iodoaryl, carboxaldehyde, and ethyne is unprecedented. The successful attachment via the iodoaryl group is extraordinarily valuable in affording a direct aryl-Si attachment. The resulting information-storage molecules can be positioned vertically from the surface, which facilitates subsequent patterning. The ability to attach via such diverse functional groups provides great versatility.

While in certain embodiments, heating is accomplished by placing the substrate in an oven, essentially any convenient heating method can be utilized, and appropriate heating and contacting methods can be optimized for particular (e.g., industrial) production contexts. Thus, for example, in certain embodiments, heating can be accomplished by dipping the surface in a hot solution containing the organic molecules that are to be attached. Local heating/patterning can be accomplished using for example a hot contact printer, or a laser. Heating can also be accomplished using forced air, a convection oven, radiant heating, and the like. The foregoing embodiments are intended to be illustrative rather than limiting.

II. The Organic Molecules.

It was a surprising discovery that a large number of organic molecules, including redox-active organic molecules, are sufficiently heat-resistant to be amenable and even quite effective in the methods of this invention. Suitable heat-resistant organic molecules typically include, but are not limited to metallocenes (e.g., ferrocene), porphyrins, expanded porphyrins, contracted porphyrins, linear porphyrin polymers, porphyrin sandwich coordination complexes, and porphyrin arrays.

Certain preferred heat-resistant organic molecules include, but are not limited to 5-[4-(S-acetylthiomethyl)phenyl]-10,15,20-trimesitylporphinatozinc(II), 5-[4-(mercaptomethyl)phenyl]-10,15,20-trimesitylporphinatozinc(II), 5-[4-(hydroxymethyl)phenyl]-10,15,20-trimesitylporphinatozinc (II), 5-[4-(hydroxymethyl)phenyl]-10,15,20-tri-p-tolylporphinatozinc(II), 5-(4-allylphenyl)-10,15,20-trimesitylporphinatozinc(II), 5-(4-formylphenyl)-15-phenyl-10,20-di-p-tolylporphinatozinc(II), 5-(4-bromomethylphenyl)-10,15,20-trimesitylporphinatozinc(II), 5-(4-ethynylphenyl)-10,15,20-trimesitylporphinatozinc(II), 5-(4-iodophenyl)-10,15,20-trimesitylporphinatozinc(II), 5-(4-bromophenyl)-10,15,20-tri-p-tolylporphinatozinc(II), 5-(4-hydroxyphenyl)-10,15,20-trimesitylporphinatozinc(II), 5,10-bis(4-ethynylphenyl)-15,20-dimesitylporphinatozinc (II), 5-[4-(4,4,5,5-tetramethyl-1,3,2-dioxaborolan-2-yl)phenyl]-10,20-bis(3,5-di-tert-butylphenyl)-15-mesitylporphinatozinc(II), 5-iodo-10,20-bis(3,5-di-tert-butylphenyl)-15-mesitylporphinatozinc(II), 5,10-bis(4-iodophenyl)-15,20-dimesitylporphinatozinc(II), 5-[4-(2-(trimethylsilyl)ethynyl)phenyl]-10,15,20-trimesitylporphinatozinc(II), 5,15-bis(4-ethynylphenyl)-10,20-dimesitylporphinatozinc(II), 5,15-bis(4-iodophenyl)-10,20-dimesitylporphinatozinc(II), 5,10,15-tris(4-ethynylphenyl)-20-mesitylporphinatozinc(II), 5,15-bis(4-ethynylphenyl)-10,20-bis(4-tert-butylphenyl) porphinatozinc(II), 5,15-bis(4-ethynylphenyl) porphinatozinc(II), 5,15-bis(3-ethynylphenyl)-10,20-dimesitylporphinatozinc(II), 5,10,15,20-tetrakis(4-ethynylphenyl)porphinatozinc(II), 5,10-bis[4-(2-(trimethylsilyl)ethynyl)phenyl]-15,20-dimesitylporphinatozinc(II), 5-(3,5-diethynylphenyl)-10,15,20-trimesitylporphinatozinc(II), 3,7-dibromo-10,20-bis(3,5-di-tert-butylphenyl)-15-mesitylporphinatozinc(II), 5-[4-(2-(trimethylsilyl)ethynyl)phenyl]-10,15,20-tri-p-tolylporphinatozinc(II), 5-[4-(Se-acetylselenomethyl)phenyl]-10,15,20-trimesitylporphinatozinc(II), 5-(4-iodophenyl)-10,20-bis(3,5-di-tert-butylphenyl)-15-mesitylporphinatozinc(II), 5,10-bis(4-ethynylphenyl)-15,20-bis(4-tert-butylphenyl)porphinatozinc(II), 5,10-bis(4-ethynylbiphen-4'-yl)-15,20-bis(4-tert-butylphenyl) porphinatozinc(II), 5-(4-vinylphenyl)-10,15,20-trimesitylporphinatozinc(II), 5-(4-vinylphenyl)-10,15,20-tri-p-tolylporphinatozinc(II), 5-(hydroxymethyl)-10,15,20-trimesitylporphinatozinc(II), 5-(4-allylphenyl)-10,15,20-tri-p-tolylporphinatozinc(II), 5-(4-allylphenyl)-10,15,20-tri-p-tolylporphinatocopper(II), type c triple decker[(tert-butyl)$_4$phthalocyaninato]Eu[(tert-butyl)$_4$phthalocyaninato]Eu[5,15-bis(4-ethynylphenyl)-10,20-bis(4-tert-butylphenyl)porphyrin], type c triple decker[(tert-butyl)$_4$phthalocyaninato]Eu[(tert-butyl)$_4$phthalocyaninato]Eu[5-[4-[2-(4-(hydroxymethyl)phenyl)ethynyl]phenyl]-10,15,20-tri-p-tolylporphyrin], 5,10-bis[4-(2-(triisopropylsilyl)ethynyl)biphen-4'-yl]-15,20-bis(4-tert-butylphenyl)porphinatozinc (II), 5,10-bis[4-(2-(triisopropylsilyl)ethynyl)phenyl]-15,20-bis(4-tert-butylphenyl)porphinatozinc(II), and the like.

The suitablity of particular molecules for use in the methods of this invention can readily be determined. The molecule(s) of interest are simply coupled to a surface (e.g., a hydrogen passivated surface) according to the methods of this invention. Then sinusoidal voltammetry can be performed (e.g., as described herein or in U.S. Pat. Nos. 6,272,038, 6,212,093, and 6,208,553, PCT Publication WO 01/03126, or by (Roth et al. (2000) *Vac. Sci. Technol. B* 18: 2359-2364; Roth et al. (2003) *J. Am. Chem. Soc.* 125: 505-517) to evaluate 1) whether or not the molecule(s) coupled to the surface, 2) the degree of coverage (coupling); and 3) whether or not the molecule degraded during the coupling procedure.

Table 1 illustrates the test results (electrochemical characteristics) of a number of porphyrins examined using the attachment procedure described herein. For those porphyrins that attached a subjective EGFP scale was used to rate their electrochemical behavior.

TABLE 1

Electrochemical behavior of porphyrins attached to a silicon substrate according to the methods described herein. All substituents are at the p-position, and each compound bears one substituent unless noted otherwise.

| cmpd # | Result | Structural element (non-linking units) |
|---|---|---|
| 16 | excellent | ZnP-PhCH$_2$SAc (mesityl) |
| 104 | excellent | ZnP-PhCH$_2$OH (mesityl) |
| 115 | excellent | ZnP-PhCH$_2$OH (p-tolyl) |
| 132 | good | TD-dpe-CH$_2$OH |
| 141 | excellent | ZnP-Ph-allyl (mesityl) |
| 153 | no attachment | ZnTPP |
| 172 | excellent | ZnP-Ph-CHO (p-tolyl; phenyl) |
| 178 | excellent | ZnP-PhCH$_2$Br (mesityl) |
| 181 | no attachment | ZnTTP |
| 182 | no attachment | ZnTMP |
| 183 | no attachment | ZnOEP |
| 184 | excellent | ZnP-PhCCH (mesityl) |
| 185 | good | ZnP-PhI (mesityl) |
| 189 | Fair | ZnP-PhBr (p-tolyl) |
| 191 | excellent | ZnP-PhOH (mesityl) |
| 192 | excellent (polymer) | cis-ZnP-(PhCCH)$_2$ (mesityl) |
| 193 | Fair | ZnP-Ph-B(OR)$_2$ (mesityl; 3,5-di-t-BuPh) |
| 194 | Fair | ZnP-I (mesityl; 3,5-di-t-BuPh) |
| 195 | good | cis-ZnP-(PhI)$_2$ (mesityl) |
| 196 | excellent | ZnP-PhCC-TMS (mesityl) |
| 197 | excellent (polymer) | trans-ZnP-(PhCCH)$_2$ (mesityl) |
| 189 | good | trans-ZnP-(PhI)$_2$ (mesityl) |
| 199 | good (polymer) | ZnP-(PhCCH)$_3$ (mesityl) |
| 200 | good | trans-ZnP-(PhCCH)$_2$ (p-t-BuPh) |
| 201 | poor | trans-ZnP-(PhCCH)$_2$ (H) |
| 202 | good | trans-ZnP-m-(PhCCH)$_2$ (mesityl) |
| 204 | poor | ZnP-(PhCCH)$_4$ |
| 205 | Fair | TD-(PhCCH)$_2$ |
| 206 | excellent | trans-ZnP-(PhCC-TMS)$_2$ (mesityl) |
| 207 | good | ZnP-Ph-3,5-(CCH)$_2$ (mesityl) |
| 208 | poor | ZnP-3,7-Br$_2$ (mesityl; 3,5-di-t-BuPh) |
| 209 | excellent | ZnP-CC-TMS (p-tolyl) |

* ZnP is a zinc porphyrin. TD is a triple-decker lanthanide sandwich coordination compound (e.g., as described in U.S. Pat. No. 6,212,093).

It is noted that the above-described compounds are meant to be illustrative and not limiting. Other suitable compounds can readily be ascertained using routine screening procedures as described herein.

It is also noted that where certain organic molecules decompose at particular sites at high temperature (e.g., 200° C. to 400° C.) the "reactive" site can often be derivatized with a stable protecting group. The molecule can be coupled to the surface according to the methods of this invention and the protecting group can then be chemically removed from the organic molecule.

The organic molecule is typically provided in a solvent, dispersion, emulsion, paste, gel, or the like. Preferred solvents, pastes, gels, emulsions, dispersions, etc., are solvents that can be applied to the Group II, III, IV, V, and/or VI material(s), and/or transition metals without substantially degrading that substrate and that solubilize or suspend, but do not degrade the organic molecule(s) that are to be coupled to the substrate. In certain embodiments, preferred solvents include high boiling point solvents (e.g., solvents with an initial boiling point greater than about 130° C., preferably greater than about 150° C., more preferably greater than about 180° C.). Such solvents include, but are not limited to benzonitrile, dimethylformamide, xylene, ortho-dichlorobenzene, and the like.

III. The Attachment Molecules.

To effect attachment to the substrate (e.g., a Group II, III, IV, V, or VI element, semiconductor, and/or oxide, and/or transition metal, transition metal oxide or nitride, etc.) the heat-resistant organic molecule either bears one or more attachment group(s) (e.g., as substituent(s)) and/or is derivatized so that it is attached directly or through a linker to one or more attachment groups.

In certain preferred embodiments, the attachment group comprises an aryl or an alkyl group. Certain preferred aryl groups include a functional group such as bromo, iodo, hydroxy, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. Certain preferred alkyls include a functional group such as bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl.

In certain embodiments the attachment groups include, but are not limited to alcohols, thiols, S-acetylthiols, bromomethyls, allyls, iodoaryls, carboxaldehydes, ethynes, and the like. In certain embodiments, the attachment groups include, but are not limited to 4-(hydroxymethyl)phenyl, 4-(S-acetylthiomethyl)phenyl, 4-(Se-acetylselenomethyl)phenyl, 4-(mercaptomethyl)phenyl, 4-(hydroselenomethyl)phenyl, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsilyl)ethynyl]phenyl, 4-bromophenyl, 4-iodophenyl, 4-hydroxyphenyl, 4-(4,4,5,5-tetramethyl-1,3,2-dioxaborolan-2-yl)phenyl bromo, iodo, hydroxymethyl, S-acetylthiomethyl, Se-acetylselenomethyl, mercaptomethyl, hydroselenomethyl, formyl, bromomethyl, chloromethyl, ethynyl, vinyl, allyl, 4-[2-(4-(hydroxymethyl)phenyl)ethynyl]phenyl, 4-(ethynyl)biphen-4'-yl, 4-[2-(triisopropylsilyl)ethynyl]biphen-4'-yl, 3,5-diethynylphenyl, 2-bromoethyl, and the like. These attachment groups are meant to be illustrative and not limiting.

The suitability of other attachment groups can readily be evaluated. A heat-resistant organic molecule bearing the attachment group(s) of interest (directly or on a linker) is coupled to a substrate (e.g., hydrogen-passivated silicon) according to the methods described herein. The efficacy of attachment can then be evaluated electrochemically, e.g., using sinusoidal voltammetry as described above.

The attachment groups can be substituent(s) comprising the heat-resistant organic molecule. Alternatively, the organic molecule can be derivatized to covalently link the attachment group(s) thereto either directly or through a linker.

Means of derivatizing molecules, e.g., with alcohols or thiols are well known to those of skill in the art (see, e.g., Gryko et al. (1999) *J. Org. Chem.*, 64: 8635-8647; Smith and March (2001) *March's Advanced Organic Chemistry*, John Wiley & Sons, 5th Edition, etc.).

Where the attachment group comprises an alcohol, in certain embodiments, suitable alcohols include, but are not limited to a primary alcohol, a secondary alcohol, a tertiary alcohol, a benzyl alcohol, and an aryl alcohol (i.e., a phenol). Certain particularly preferred alcohols include, but are not limited to 2 to 10 carbon straight chain alcohols, benzyl alcohol, and phenethyl alcohol.

When the attachment group comprises a thiol, in certain embodiments, suitable thiols include, but are not limited to a primary thiol, a secondary thiol, a tertiary thiol, a benzyl thiol, and an aryl thiol. Particularly preferred thiols include, but are not limited to 2 to 10 carbon straight chain thiols, benzyl thiol, and phenethyl thiol.

IV. The Substrate.

The methods of this invention are suitable for covalently coupling organic molecules to essentially any or all Group II, III, IV, V, or VI materials (e.g., Group II, III, IV, V, or VI elements, semiconductors, and/or oxides thereof) and/or to transition metals, transition metal oxides, transition metal nitrides, alloys or composites comprising transition metals, and the like. In certain preferred embodiments, the substrates comprise all Group III, IV, or V materials (e.g., carbon, silicon, germanium, tin, lead), doped Group II, III, IV, V, and VI elements, or oxides of pure or doped Group II, III, IV, V, or VI elements or transition metals, transition metal oxides or transition metal nitrides. In certain preferred embodiments the surface is Group III, IV, or V material, more preferably a Group IV material (oxide, and/or doped variant), still more preferably a silicon or germanium surface or a doped and/or oxidized silicon or germanium surface.

It will be understood from the teachings herein that in certain embodiments, the materials that can be used for a substrate include, but are not limited to Si, Ge, SiC, Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, and their oxides and nitrides.

The group II, III, IV, V, or VI element, transition metal, transition metal oxide or nitride can be essentially pure, or it can be doped (e.g., p- or n-doped) and/or alloyed. P- and n-dopants for use with Group II-VI elements, in particular for use with Groups III, IV, and V elements, more particularly for use with Group IV elements (e.g., silicon, germanium, etc.) are well known to those of skill in the art. Such dopants include, but are not limited to phosphorous compounds, boron compounds, arsenic compounds, aluminum compounds, and the like. Many doped Group II, III, IV, V, or VI elements are semiconductors and include, but are not limited to ZnS, ZnSe, ZnTe, CdS, CdSe, CdTe, MgS, MgSe, MgTe, CaS, CaSe, CaTe, SrS, SrSe, SrTe, BaS, BaSe, BaTe, GaN, GaP, GaAs, GaSb, InP, InAs, InSb, AlS, AlP, AlSb, PbS, PbSe, Ge and Si and ternary and quaternary mixtures thereof.

The surface can take essentially any form. For example, it can be provided as a planar substrate, an etched substrate, a deposited domain on another substrate and the like. Particularly preferred forms include those forms of common use in solid state electronics fabrication processes.

Although not necessarily required, in certain embodiments the surface is cleaned before use, e.g., using standard methods known to those of skill in the art. Thus, for example, in one preferred embodiment, the surface can be cleaned by sonication in a series of solvents (e.g., acetone, toluene, acetone, ethanol, and water) and then exposed to a standard wafer-cleaning solution (e.g., Piranha (sulfuric acid: 30% hydrogen peroxide, 2:1)) at an elevated temperature (e.g., 100° C.).

In certain embodiments, oxides can be removed from the substrate surface and the surface can be hydrogen passivated. A number of approaches to hydrogen passivation are well known to those of skill in the art. For example, in one approach, a flow of molecular hydrogen is passed through dense microwave plasma across a magnetic field. The magnetic field serves to protect the sample surface from being bombarded by charged particles. Hence the crossed beam (CB) method makes it possible to avoid plasma etching and heavy ion bombardment that are so detrimental for many semiconductor devices (see, e.g., Balmashnov, et al. (1990) *Semiconductor Science and Technology,* 5: 242). In one particularly preferred embodiment, passivation is by contacting the surface to be passivated with an ammonium fluoride solution (preferably sparged of oxygen).

Other methods of cleaning and passivating surfaces are known to those of skill in the art (see, e.g., Choudhury (1997) *The Handbook of Microlithography, Micromachining, and Microfabrication,* Soc. Photo-Optical Instru. Engineer, Bard & Faulkner (1997) *Fundamentals of Microfabrication,* and the like).

V. Patterning the Organic Molecule(s) on the Substrate

In certain embodiments, the heat-resistant organic molecules are attached to form a uniform film across the surface of the substrate. In other embodiments, the organic molecules are separately coupled at one or more discrete locations on the surface. In certain embodiments, different molecules are coupled at different locations on the surface.

The location at which the molecules are coupled can be accomplished by any of a number of means. For example, in certain embodiments, the solution(s) comprising the organic molecule(s) can be selectively deposited at particular locations on the surface. In certain other embodiments, the solution can be uniformly deposited on the surface and selective domains can be heated. In certain embodiments, the organic molecules can be coupled to the entire surface and then selectively etched away from certain areas.

The most common approach to selectively contacting the surface with the organic molecule(s) involves masking the areas of the surface that are to be free of the organic molecules so that the solution or gas phase comprising the molecule(s) cannot come in contact with those areas. This is readily accomplished by coating the substrate with a masking material (e.g., a polymer resist) and selectively etching the resist off of areas that are to be coupled. Alternatively a photoactivatible resist can be applied to the surface and selectively activated (e.g., via UV light) in areas that are to be protected. Such "photolithographic" methods are well known in the semiconductor industry (see e.g., Van Zant (2000) *Microchip Fabrication: A Practical Guide to Semiconductor Processing*; Nishi and Doering (2000) *Handbook of Semiconductor Manufacturing Technology*; Xiao (2000) *Introduction to Semiconductor Manufacturing Technology*; Campbell (1996) *The Science and Engineering of Microelectronic Fabrication* (Oxford Series in Electrical Engineering), Oxford University Press, and the like). In addition, the resist can be patterned on the surface simply by contact printing the resist onto the surface.

In other approaches, the surface is uniformly contacted with the molecules. The molecules can then be selectively etched off the surface in areas that are to be molecule free. Etching methods are well know to those of skill in the art and include, but are not limited to plasma etching, laser etching, acid etching, and the like.

Other approaches involve contact printing of the reagents, e.g., using a contact print head shaped to selectively deposit the reagent(s) in regions that are to be coupled, use of an inkjet apparatus (see e.g., U.S. Pat. No. 6,221,653) to selectively deposit reagents in particular areas, use of dams to selectively confine reagents to particular regions, and the like.

In certain preferred embodiments, the coupling reaction is repeated several times. After the reaction(s) are complete, uncoupled organic molecules are washed off of the surface, e.g., using standard wash steps (e.g., benzonitrile wash followed by sonication in dry methylene chloride).

The foregoing methods are intended to be illustrative. In view of the teachings provided herein, other approaches will be evident to those of skill in the semiconductor fabrication arts.

VI. Industrial Scale-Up.

Figure 9:
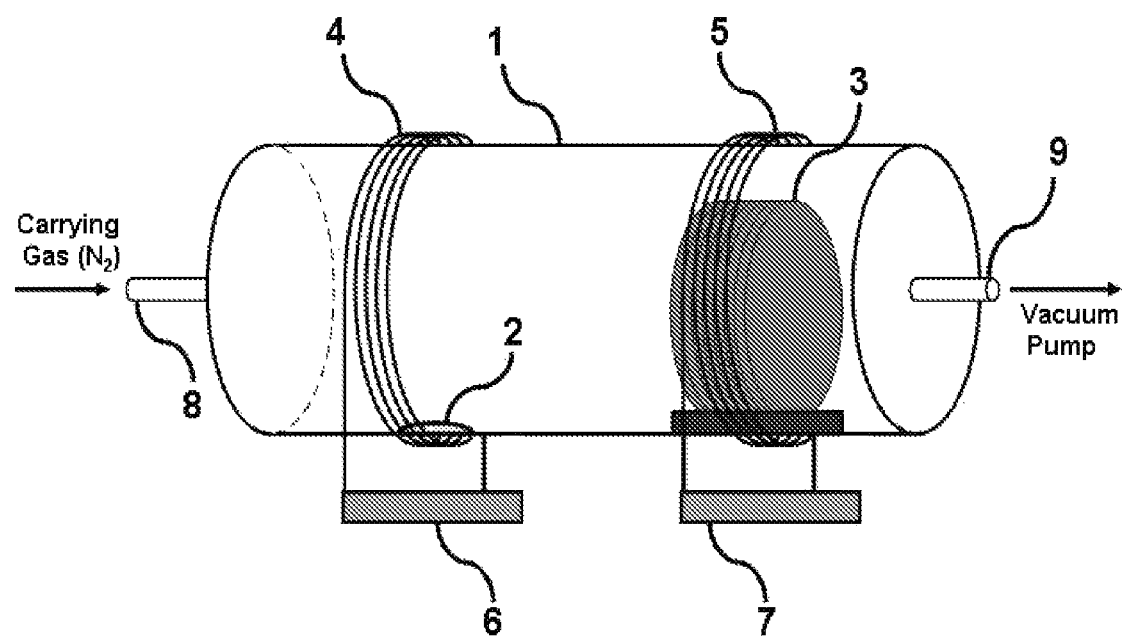
FIG. 9 illustrates a two-zone furnace for gas phase molecular attachment.

The methods of this invention are readily scaled up for use in commercial manufacturing operations. One such scaled-up approach is illustrated in FIG. 9. This figure illustrates a two-zone furnace 1 for gas phase molecular attachment. In device, the molecule powder 2 is kept in one zone and the wafers 3 are kept in different zone. Each zone can be individually heated (e.g. by a heater(s) 4, 5 that can be independently regulated by a single heater control or by separate heater controls (6 and 7 in the illustration). Each zone can be independently heated to the required temperature. One can control the molecule vapor pressure by changing the temperature. This system also allows the use of a carrier gas (e.g. Ar, $N_2$, etc.), fed through a gas inlet 8, through the oven to a gas outlet 9, which can be used to transport the molecule vapors to the wafers in other zone. This furnace can also be operated at low pressures (sub-atmospheric) by evacuating the system with a pump at the outlet of carrier gas. The low pressure process allows the molecule vapor pressure to be controlled very precisely. Also, it reduces the amount of impurities compared to the atmospheric process.

Figure 10:
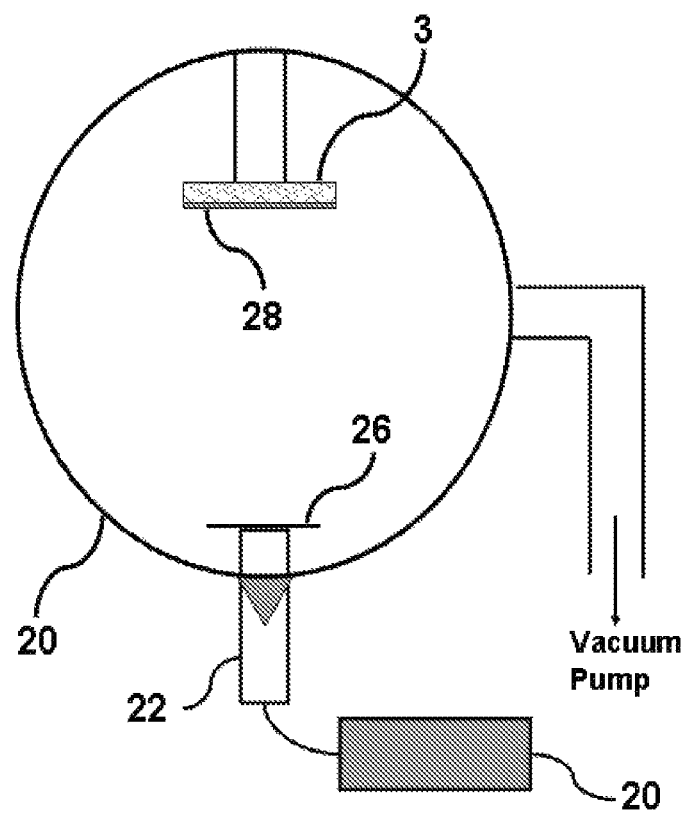
FIG. 10 illustrates an epitaxy system utilizing a K-cell for attachment of organic molecules to a substrate.

Another equipment configuration, illustrated FIG. 10, is suitable for high vacuum operation of the gas phase molecular attachment method. In this approach, the substrate 3 is placed in a vacuum furnace chamber 20. The molecule(s) that are to be attached are kept in an effusion cell (e.g. a knudson-cell (K-cell), for example the Low Temperature Effusion Cell by Specs) 22 which is controlled by an effusion cell controller 24. By opening and closing the shutter 26 on the k-cell, one can control the amount of molecules that can reach the substrate surface and form an attached monolayer 28.

These methods are meant to be illustrative and not limiting. Using the teachings provided herein, one of skill in the art can devise numerous approaches for heating and contacting the molecules described herein with a surface. Devices and methods for heating and/or volatilizing the heat-resistant molecules or mixtures of such molecules and patterning or uniformly depositing them on a surface at elevated temperature are commercially available and well known to those of skill in the art. Such methods include, but are not limited to molecular beam epitaxy (MBE) (equipment available for example, from SPECS Scientific Instruments, Inc., Florida), chemical vapor deposition (CVD) (equipment available, for example, from CVD Equipment Corp.), Liquid Phase Epitaxial deposition (LPE) (equipment available, for example, from CVD Equipment Corp., Ronkonkoma, N.Y.), and the like.

VII. High Charge Density Materials.

It was a surprising discovery of this invention that the methods described herein, of coupling redox-active molecules to a doped or undoped substrate (e.g., a substrate comprising a group III, IV, or V element, a transition metal, a transition metal oxide, nitride, and the like) results in higher and more uniform packing of the organic molecules (e.g., redox-active species) than other previously known methods. With redox-active organic molecules this can manifest as lower oxidative current at higher anodic potentials observed in voltametric measurements. In addition, a cyclic voltammogram shows sharper and more symmetric peaks.

In addition, the improved uniformity and higher packing density of redox-active molecules on the substrate results in materials capable of storing a significantly higher charge density. Thus, in preferred embodiments, this invention provides a substrate, (e.g. a group IV element substrate) having coupled thereto one or more redox-active species that can store charge at a charge density of at least about 75 µCoulombs/$cm^2$, preferably at least about 100 µCoulombs/$cm^2$, more preferably at least about 150 µCoulombs/$cm^2$, and most preferably of at least about 200 or 250 µCoulombs/$cm^2$ per non-zero oxidation state of the redox-active molecules. Such materials are useful in the fabrication of molecular memories (memory chips).

Where various binding moieties are used instead of redox-active species, the high uniformity and molecule density provides sensors having greater sensitivity and selectivity for a particular analyte.

VIII. Uses of Organic Molecules Coupled to a Substrate.

The methods of this invention can be used to attach essentially any heat-resistant organic molecule to a Group II, III, IV, V, or VI material surface, preferably to a Group III, IV, or V surface and/or to a transition metal surface. In certain preferred embodiments, the molecule is a redox-active molecule and can be used to form a molecular memory. In other preferred embodiments, the molecule can be essentially any other heat-resistant molecule. Certain other heat-resistant molecules include, but are not limited to binding partner (e.g., certain antibodies, ligands, nucleic acids, sugars, etc.) and can be used to form a sensor for detecting particular analyte(s).

In "molecular memory" redox-active molecules (molecules having one or more non-zero redox states) coupled to the transition metals and/or Group II, III, IV, V, or VI materials are used to store bits (e.g., each redox state can represent a bit). The redox-active molecule attached to the substrate material (e.g., silicon, germanium, etc.) forms a storage cell capable of storing one or more bits in various oxidation states. In certain embodiments, the storage cell is characterized by a fixed electrode electrically coupled to a "storage medium" comprising one or more redox-active molecules and having a multiplicity of different and distinguishable oxidation states. Data is stored in the (preferably non-neutral) oxidation states by the addition or withdrawal of one or more electrons from said storage medium via the electrically coupled electrode. The oxidation state of the redox-active molecule(s) can be set and/or read using electrochemical methods (e.g., cyclic voltammetry), e.g., as described in U.S. Pat. Nos. 6,272,038, 6,212,093, and 6,208,553 and PCT Publication WO 01/03126.

Because transition metals and group II, III, IV, V, and VI materials, in particular group IV materials (e.g., silicon, germanium, etc.), are commonly used in electronic chip fabrication, the methods provided herein readily lend themselves to the fabrication of molecular memory chips compatible with existing processing/fabrication technologies. In addition, details on the construction and use of storage cells comprising redox-active molecules can be found, in U.S. Pat. Nos. 6,272, 038, 6,212,093, and 6,208,553 and PCT Publication WO 01/03126.

Certain preferred redox-active molecules suitable for use in this invention are characterized by having a multiplicity of oxidation states. Those oxidation states are provided by one or more redox-active units. A redox-active unit refers to a molecule or to a subunit of a molecule that has one or more discrete oxidation states that can be set by application of an appropriate voltage. Thus, for example, in one embodiment, the redox-active molecule can comprise two or more (e.g., 8) different and distinguishable oxidation states. Typically, but not necessarily, such multi-state molecules will be composed of several redox-active units (e.g., porphyrins or ferrocenes). Each redox-active molecule is itself at least one redox-active unit, or comprises at least one redox-active unit, but can easily comprise two or more redox-active units.

Preferred redox-active molecules include, but are not limited to porphyrinic macrocycles. Particularly preferred redox-active molecules include a porphyrin, an expanded porphyrin, a contracted porphyrin, a ferrocene, a linear porphyrin polymer, a porphyrin sandwich coordination complex, and a porphyrin array.

In certain embodiments, the redox-active molecule is a metallocene as shown in Formula I.

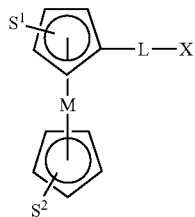

where L is a linker, M is a metal (e.g., Fe, Ru, Os, Co, Ni, Ti, Nb, Mn, Re, V, Cr, W), $S^1$ and $S^2$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. In preferred embodiments, a substituted aryl group is attached to the porphyrin, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Certain suitable substituents include, but are not limited to, 4-chlorophenyl, 3-acetamidophenyl, 2,6-dichloro-4-trifluoromethyl, and the like. Preferred substituents provide a redox potential range of less than about 2 volts. X is selected from the group consisting of a substrate, a reactive site that can covalently couple to a substrate (e.g., an alcohol, a thiol, etc.). It will be appreciated that in some embodiments, L-X is an alcohol or a thiol. In certain instances L-X can be replaced with another substituent ($S^3$) like $S^1$ or $S^2$. In certain embodiments, L-X can be present or absent, and when present preferably is 4-hydroxyphenyl, 4-(2-(4-hydroxyphenyl)ethynyl) phenyl, 4-(hydroxymethyl)phenyl, 4-mercaptophenyl, 4-(2-(4-mercaptophenyl)ethynyl)phenyl, 4-mercaptomethylphenyl, 4-hydroselenophenyl, 4-(2-(4-hydroselenophenyl)ethynyl)phenyl, 4-hydrotellurophenyl, 4-(hydroselenomethyl)phenyl, 4-(2-(4-hydrotellurophenyl) ethynyl)phenyl, 4-(hydrotelluromethyl)phenyl, and the like.

The oxidation state of molecules of Formula I is determined by the metal and the substituents. Various suitable metallocenes are disclosed in U.S. Pat. Nos. 6,272,038, 6,212,093, and 6,208,553, and PCT Publication WO 01/03126.

Other suitable redox-active molecules include, but are not limited to porphyrins illustrated by Formula II.

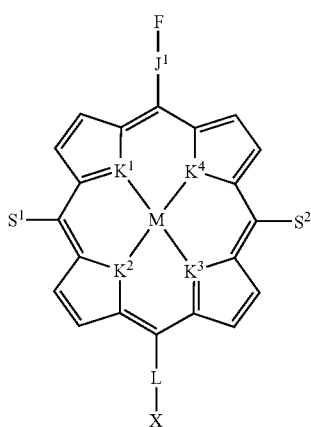

where, F is a redox-active subunit (e.g., a ferrocene, a substituted ferrocene, a metalloporphyrin, or a metallochlorin, etc.), $J^1$ is a linker, M is a metal (e.g., Zn, Mg, Cd, Hg, Cu, Ag, Au, Ni, Pd, Pt, Co, Rh, Ir, Mn, B, Al, Ga, Pb, and Sn), $S^1$ and $S^2$ are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, $K^1$, $K^2$, $K^3$, and $K^4$ are independently selected from the group consisting of N, O, S, Se, Te, and CH; L is a linker; X is selected from the group consisting of a substrate, a reactive site that can covalently couple to a substrate. In preferred embodiments, X or L-X is an alcohol or a thiol. In some embodiments L-X can be eliminated and replaced with a substituent independently selected from the same group as $S^1$ or $S^2$.

Other suitable molecules include, but are not limited to 5-[4-(S-acetylthiomethyl)phenyl]-10,15,20-trimesitylporphinatozinc(II), 5-[4-(mercaptomethyl)phenyl]-10,15,20-trimesitylporphinatozinc(II), 5-[4-(hydroxymethyl)phenyl]-10,15,20-trimesitylporphinatozinc(II), 5-[4-(hydroxymethyl)phenyl]-10,15,20-tri-p-tolylporphinatozinc(II), 5-(4-allylphenyl)-10,15,20-trimesitylporphinatozinc(II), 5-(4-formylphenyl)-15-phenyl-10,20-di-p-tolylporphinatozinc(II), 5-(4-bromomethylphenyl)-10,15,20-trimesitylporphinatozinc(II), 5-(4-ethynylphenyl)-10,15,20-trimesitylporphinatozinc(II), 5-(4-iodophenyl)-10,15,20-trimesitylporphinatozinc(II), 5-(4-bromophenyl)-10,15,20-tri-p-tolylporphinatozinc(II), 5-(4-hydroxyphenyl)-10,15,20-trimesitylporphinatozinc(II), 5,10-bis(4-ethynylphenyl)-15,20-dimesitylporphinatozinc(II), 5-[4-(4,4,5,5-tetramethyl-1,3,2-dioxaborolan-2-yl)phenyl]-10,20-bis(3,5-di-tert-butylphenyl)-15-mesitylporphinatozinc(II), 5-iodo-10,20-bis(3,5-di-tert-butylphenyl)-15-mesitylporphinatozinc(II), 5,10-bis(4-iodophenyl)-15,20-dimesitylporphinatozinc(II), 5-[4-(2-(trimethylsilyl)ethynyl) phenyl]-10,15,20-trimesitylporphinatozinc(II), 5,15-bis(4-ethynylphenyl)-10,20-dimesitylporphinatozinc(II), 5,15-bis (4-iodophenyl)-10,20-dimesitylporphinatozinc(II), 5,10,15-tris(4-ethynylphenyl)-20-mesitylporphinatozinc(II), 5,15-bis(4-ethynylphenyl)-10,20-bis(4-tert-butylphenyl) porphinatozinc(II), 5,15-bis(4-ethynylphenyl) porphinatozinc(II), 5,15-bis(3-ethynylphenyl)-10,20-dimesitylporphinatozinc(II), 5,10,15,20-tetrakis(4-ethynylphenyl)porphinatozinc(II), 5,10-bis[4-(2-(trimethylsilyl)ethynyl)phenyl]-15,20-dimesitylporphinatozinc(II), 5-(3,5-diethynylphenyl)-10,15,20-trimesitylporphinatozinc(II), 3,7-dibromo-10,20-bis(3,5-di-tert-butylphenyl)-15-mesitylporphinatozinc(II), 5-[4-(2-(trimethylsilyl)ethynyl)phenyl]-10,15,20-tri-p-tolylporphinatozinc(II), 5-[4-(Se-acetylselenomethyl) phenyl]-10,15,20-trimesitylporphinatozinc(II), 5-(4-iodophenyl)-10,20-bis(3,5-di-tert-butylphenyl)-15-mesitylporphinatozinc(II), 5,10-bis(4-ethynylphenyl)-15,20-bis(4-tert-butylphenyl)porphinatozinc(II), 5,10-bis(4-ethynylbiphen-4'-yl)-15,20-bis(4-tert-butylphenyl) porphinatozinc(II), 5-(4-vinylphenyl)-10,15,20-trimesitylporphinatozinc(II), 5-(4-vinylphenyl)-10,15,20-tri-p-tolylporphinatozinc(II), 5-(hydroxymethyl)-10,15,20-trimesitylporphinatozinc(II), 5-(4-allylphenyl)-10,15,20-tri-p-tolylporphinatozinc(II), 5-(4-allylphenyl)-10,15,20-tri-p-tolylporphinatocopper(II), type c triple decker[(tert-butyl)$_4$ phthalocyaninato]Eu[(tert-butyl)$_4$phthalocyaninato]Eu[5, 15-bis(4-ethynylphenyl)-10,20-bis(4-tert-butylphenyl)porphyrin], type c triple decker[(tert-butyl)$_4$phthalocyaninato] Eu[(tert-butyl)$_4$phthalocyaninato]Eu[5-[4-[2-(4-(hydroxymethyl)phenyl)ethynyl]phenyl]-10,15,20-tri-p-tolylporphyrin], 5,10-bis[4-(2-(triisopropylsilyl)ethynyl) biphen-4'-yl]-15,20-bis(4-tert-butylphenyl)porphinatozinc (II), 5,10-bis[4-(2-(triisopropylsilyl)ethynyl)phenyl]-15,20-bis(4-tert-butylphenyl)porphinatozinc(II), and the like.

Control over the hole-storage and hole-hopping properties of the redox-active units of the redox-active molecules used in the memory devices of this invention allows fine control over the architecture of the memory device.

Such control is exercised through synthetic design. The hole-storage properties depend on the oxidation potential of the redox-active units or subunits that are themselves or that are used to assemble the redox-active storage media used in the devices of this invention. The hole-storage properties and redox potential can be tuned with precision by choice of base molecule(s), associated metals and peripheral substituents (Yang et al. (1999) *J. Porphyrins Phthalocyanines*, 3: 117-147). The design of molecules for molecular memory is discussed in detail in U.S. Pat. Nos. 6,272,038, 6,212,093, and 6,208,553, and PCT Publication WO 01/03126.

IX. Kits.

In still another embodiment, this invention provides kits for practice of the method of this invention or for use of the materials produced by methods of this invention. In one embodiment, the kit comprises one or more reagents used to couple an organic molecule to a type II, III, IV, V, or VI material according to the methods of this invention. Such reagents include, but are not limited to reagents for cleaning and/or passivating the material surface, and/or the organic molecule(s) that are to be coupled to the surface, and/or attachment molecules for derivatizing the organic molecule(s) (e.g., reagents for derivatizing an organic molecule with an attachment group, e.g. an alcohol, thiol, S-acetylthiol, bromomethyl, allyl, iodoaryl, carboxaldehyde, ethyne, vinyl, hydroxymethyl, etc. as described herein), and/or solvents for use in coupling the derivatized organic molecule to the surface, and/or reagents for washing the derivatized surface, and the like.

In certain embodiments, the kits comprise a type II, III, IV, V, or VI material having a heat-resistant organic molecule (e.g., a redox-active molecule) coupled thereto as described herein. The type II, III, IV, V, or VI material can, in certain embodiments, comprise a molecular memory and in, certain embodiments, comprise a sensor.

In addition, the kits can optionally include instructional materials containing directions (i.e., protocols) for the practice of the methods of this invention. Preferred instructional materials provide protocols utilizing the kit contents for coupling a heat-resistant organic molecule to a type II, III, IV, V, or VI material according to the methods of this invention, and/or for using type II, III, IV, V, or VI materials having coupled organic molecules as memory elements or as sensors. While the instructional materials typically comprise written or printed materials they are not limited to such. Any medium capable of storing such instructions and communicating them to an end user is contemplated by this invention. Such media include, but are not limited to electronic storage media (e.g., magnetic discs, tapes, cartridges, chips), optical media (e.g., CD ROM), and the like. Such media may include addresses to internet sites that provide such instructional materials.

EXAMPLES

The following examples are offered to illustrate, but not to limit the claimed invention.

Example 1

Molecules can perform in Electronic Devices under Real-World Processing and Operating Conditions The central tenet of the field of molecular electronics is that molecular components can be used as functional elements in place of the semiconductor-based devices present in conventional microcircuitry (Kwok and Ellenbogen (2002) *Materials Today*, 28-37; Carroll and Gorman (2002) *Angew. Chem. Int. Ed.* 41: 4378-4400). To serve in this role, the molecular components should remain robust under daunting conditions including high-temperature (e.g., 400° C.) processing steps during manufacture and very large numbers ($10^9$-$10^{12}$) of operational cycles over a lifetime (*International Technology Roadmap for Semiconductors* (ITRS), Semiconductor Industry Association, San Jose, Calif. (2000)). There has been considerable skepticism whether molecular materials possess adequate stability to meet such requirements. Herein, we demonstrate that porphyrin-based information storage media meet the processing and operating challenges required for use in computational devices.

Our approach for molecular-based information storage employs redox-active porphyrin molecules as charge-storage elements (Roth et al. (2000) *Vac. Sci. Technol. B* 18: 2359-2364). We have shown that these molecules can be covalently attached to device-grade silicon platforms to form the basis of first-generation hybrid molecular/semiconductor devices (Roth et al. (2003) *J. Am. Chem. Soc.* 125: 505-517). The porphyrin-based information storage elements exhibit charge-retention times that are long (minutes) compared with those of the semiconductor elements in dynamic random access memory (milliseconds) (Roth et al. (2000) *Vac. Sci. Technol. B* 18: 2359-2364; Roth et al. (2003) *J. Am. Chem. Soc.* 125: 505-517). These molecules also exhibit redox characteristics that make them amenable for use as multibit information-storage media.

Figure 6A:
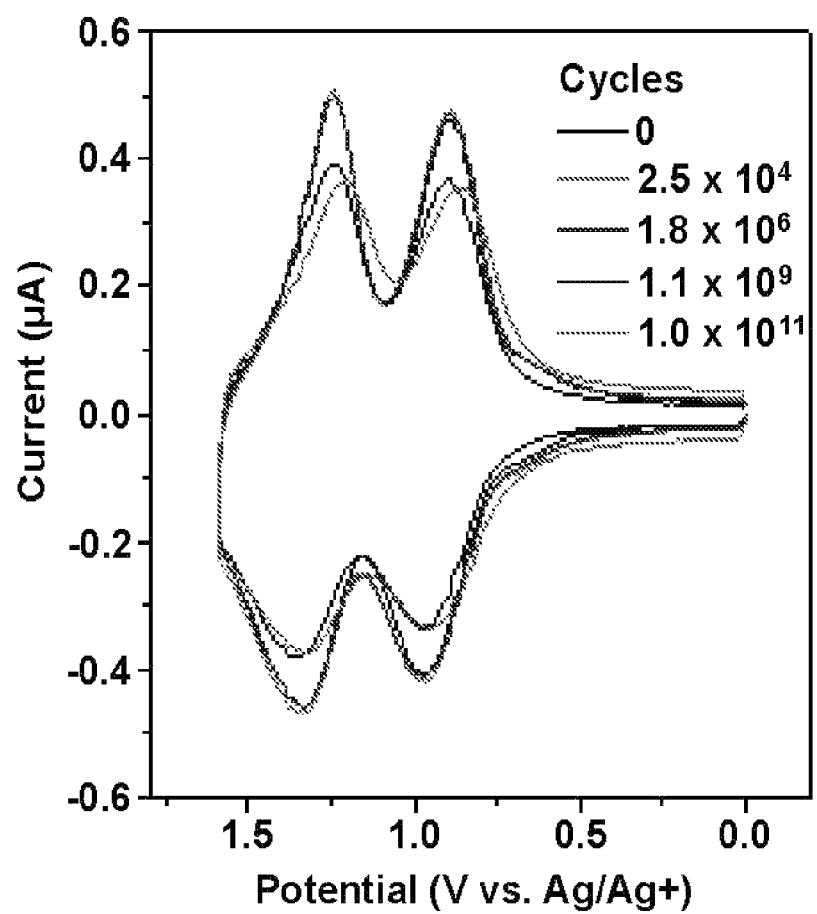

FIG. 6A shows the cyclic voltammetric behavior of a porphyrin monolayer tethered to Si(100) via a Si—O—C linkage. This monolayer was formed by placing a small amount (~1 µL) of a dilute solution (~100 µM) on a micron-scale photolithographically patterned, hydrogen-passivated Si(100) platform and baking the sample at 400° C. for several minutes under inert atmosphere conditions. The voltammetric response of the porphyrin monolayer is identical to that of porphyrin monolayers formed at much lower temperatures (100-200° C. for several hours) (Roth et al. (2003) *J. Am. Chem. Soc.* 125: 505-517) and demonstrates that molecular integrity is maintained at temperatures where most organic molecules thermally decompose. The high-temperature procedure is readily adaptable to current semiconductor fabrication technology and has the important added benefit that extremely small quantities of material are needed to make a device.

Figure 6B:
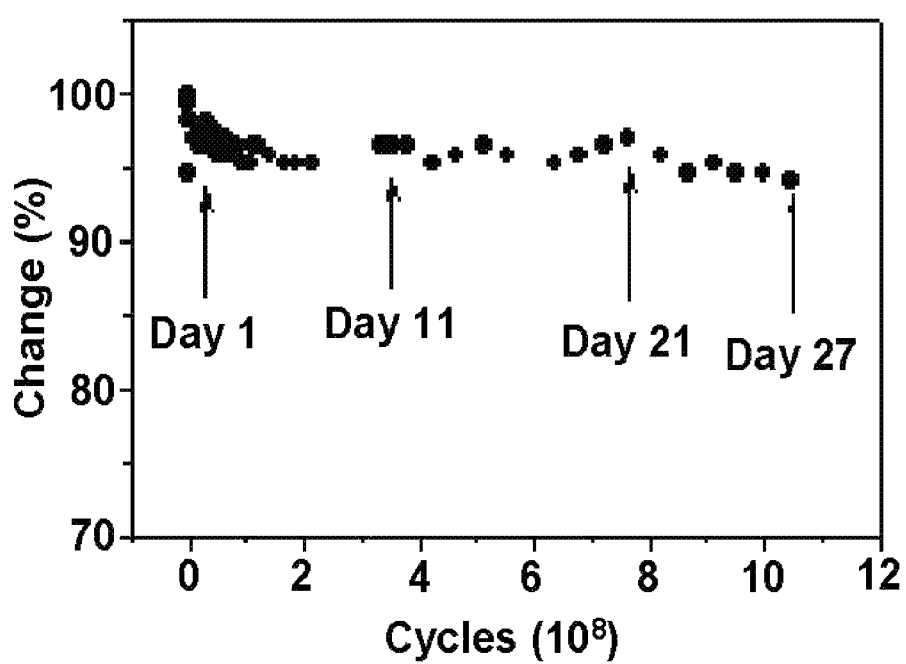
FIG. 6B shows the integrated voltammetric signal (corresponding to the charge in the monolayer) plotted as a function of the number of cycles.

The robustness of the porphyrin information-storage medium was examined by repeatedly performing the cycle of (1) oxidizing the electrically neutral monolayer and (2) reducing the resulting positively charged monolayer to its electrically neutral state. The oxidation event is equivalent to writing a bit of information; the reduction event is equivalent to erasing or destructively reading out the information. The five voltammograms in FIG. 6A show the response of the system after 0, $2.5 \times 10^4$, $1.8 \times 10^6$, $1.1 \times 10^9$, and $1.0 \times 10^{10}$ oxidation/reduction cycles. During the experiment, the nature of the electrical cycling was varied. On some days, the system was continuously cycled for 24 hrs. On others, cycling was stopped intentionally for periods ranging from a few minutes up to 12 hrs. At one point, cycling was stopped unintentionally due to an electrical power failure. The data indicate that after an initial "burn-in" period of ~$10^7$ cycles the voltammetric response stabilizes. This robustness of the system is further illustrated in FIG. 6B wherein the integrated voltammetric signal (corresponding to the charge in the monolayer) is plotted as a function of the number of cycles. These data indicate that the charge-storage characteristics of the monolayer exhibit minimal variation (few percent) over the course of the entire experiment. At the time cycling was arbitrarily stopped (>$10^{10}$ cycles; ~27 days), the system showed no signs of degradation. Collectively, these data indicate that the porphyrin-based information storage medium is extremely robust and augur well for the use of selected molecules in hybrid molecular/semiconductor electronic devices.

Example 2

Solvent Free Attachment

FIG. 7 illustrates an experimental set-up that was used to prove the concept of gas phase molecular attachment. As illustrated in panel (a), we put a drop of molecular solution (redox-active porphyrin in tetrahydrofuran, (THF) solvent) on top of a piece of silicon wafer in a vial. A second piece of silicon wafer was placed next to it. We then sealed the vial and purged it with argon for several minutes to remove/dry THF. This leaves only a molecule powder on the first silicon piece. During the purge, the argon flow was kept low so that no molecule powder would be blown to the other silicon chip. After this step, the vials were heated at various temperatures (300-400° C. for 10-20 min). Afterwards the vials were cooled down to room temperature, and the silicon pieces were rinsed with dichloromethane.

A second set-up is illustrated in FIG. 7 (panel b), where no solvent was involved. We sealed the powder comprising the molecule together with a silicon piece in a vial, and made sure that they were not touching each other. The vials were then purged with argon making sure that no powder was blown over on the silicon surface. Then the vials were heated at 300-400° C. for 10-20 min.

FIG. 7, panel (c) shows the third set-up used (panel c) where the silicon substrate was kept facing the powder comprising the molecule (distance of few millimeters). The rest of the procedure was similar to that described above.

Figure 8:
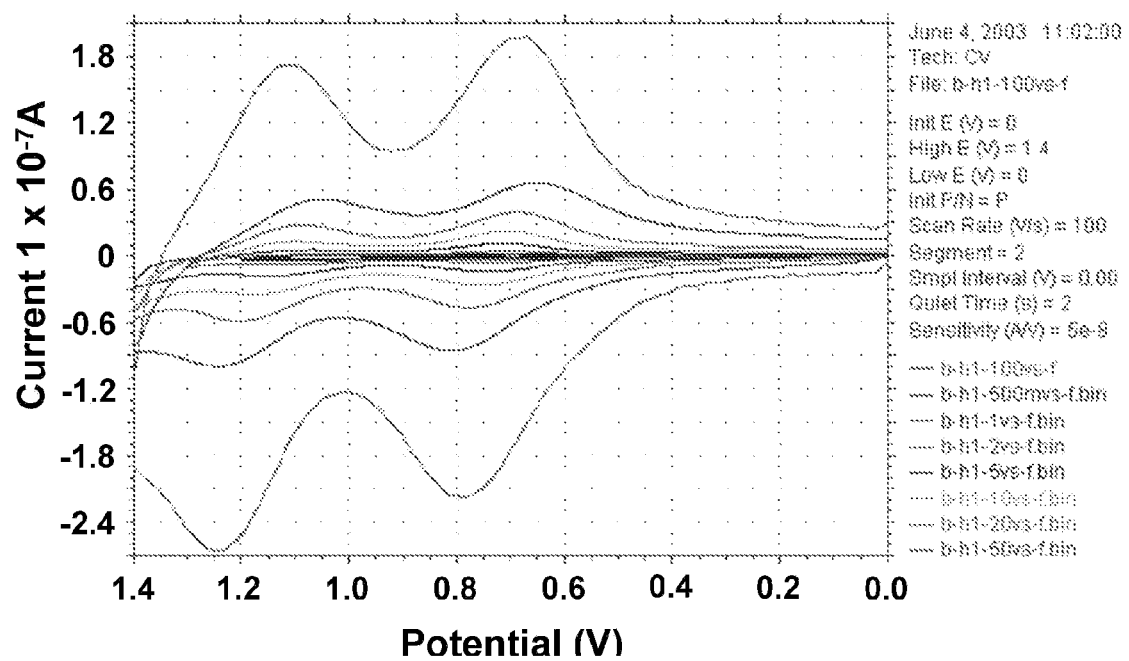
FIG. 8 shows the cyclic voltammetry (CyV) measurements from one of the samples prepared as illustrated in FIG. 7, panel (a), where the sample did not touch the molecular solution during the process.

FIG. 8 shows the cyclic voltammetry (CyV) measurements from one of the samples prepared as illustrated in panel (a), where the sample did not touch the molecular solution during the process. We can clearly see the peaks associated with the redox activity of the molecule. The molecule coverage density derived from this plot is $1\times10^{13}$-$2\times10^{13}$ cm$^{-2}$ for oxidation and reduction peaks, which is comparable with the results from traditional direct liquid phase attachment process. Also, the redox peak potentials matched our previous data.

The sample prepared according to the method illustrated in panel (b) of FIG. 7 had electrical properties very similar to those of the sample prepared according to the method illustrated in panel (a). The attachment density was found to be $8\times10^{13}$-$1\times10^{14}$ cm$^{-2}$ for this sample. These values are higher than those we obtained using the first approach, which may be caused by higher molecule vapor pressure in this case.

The sample produced according to the method illustrated in panel (c) of FIG. 7 had electrical properties very similar to those of the sample prepared according to the method illustrated in panel (b), but provide higher attachment since the spacing between the molecules and the sample was reduced.

These experiments show that molecular attachment with high density and integrity can be achieved by a completely "dry" process that does not require any solvents. We believe that this approach will be better suited to conventional manufacturing processes than the "wet" methods. In addition, this "dry" attachment is also compatible with large scale low cost processing.

Example 3

Facile Covalent Attachment of Porphyrins to Semiconductor Surfaces via High Temperature Processes The field of molecular electronics has been driven by the prospect that devices that rely on the bulk properties of semiconductors will fail to retain the required characteristics to function when feature sizes reach nanoscale dimensions. As a consequence, there has been much interest in developing molecular-based electronic materials for use in both memory architectures and circuit elements (see, e.g., Kwok et al. *Materials Today* (February 2002), 28-37; Carroll and Gorman (2002) *Angew. Chem. Int. Ed.*, 41: 4378-4400). Towards this goal, we have been engaged in a program aimed at constructing devices that use the properties of molecules to store information (Roth et al. (2000) *Vac. Sci. Technol. B* 18: 2359-2364; Roth et al. (2003) *ACS Symp. Series*, 844: 51-61; Roth et al. (2003) *Am. Chem. Soc.*, 125: 505-517; Li et al. (2002) *Appl. Phys. Lett.*, 81: 1494-1496; Li et al. (2003) *Appl. Phys. Lett.*, 83: 198-200.). In our approach, a collection of redox-active porphyrinic molecules attached to an electroactive surface serves as the active storage medium, and information is stored in the discrete redox states of the molecules. The focus of our work has been developing a hybrid architecture, where the molecular material is attached to a semiconductor platform. The implementation of hybrid molecular/semiconductor architectures as a transition technology leverages the vast infrastructure of the semiconductor industry with the advantages afforded by molecular-based active media.

We have shown that porphyrins (Roth et al. (2003) *Am. Chem. Soc.*, 125: 505-517) and ferrocenes (Roth et al. (2003) *Am. Chem. Soc.*, 125: 505-517; Li et al. (2002) *Appl. Phys. Lett.*, 81: 1494-1496) can be attached to single-crystal Si platforms (and Si platforms modified with an oxide overlayer (Li et al. (2003) *Appl. Phys. Lett.*, 83: 198-200) to form the basis of hybrid molecular/semiconductor devices. One procedure for attaching the porphyrins to the Si platforms (either hydrogen-passivated or iodine-modified) involved depositing a drop of an alcohol-functionalized molecule in a high-boiling solvent (e.g., benzonitrile) onto a photolithographically patterned micron-size Si electrode, followed by heating at ~170° C. for several hrs, during which time additional solvent was added to the sample area (Roth et al. (2003) *Am. Chem. Soc.*, 125: 505-517). Although this procedure produced high quality monolayers, the procedure is time consuming and not readily adaptable to commercial processing at the wafer level.

The limitations of this procedure for the attachment of porphyrins to Si platforms prompted us to explore alternative strategies. In this regard, there have been a number of recent studies exploring the attachment of organic molecules to Si surfaces (Song and Sailor (1999) *Comments on Inorganic Chemistry*, 21: 69-84; Bent (2002) *Surf Sci.*, 500: 879-903; Buriak (2002) *J. Chem. Rev.*, 102, 1271-1308). These strategies offer no advantages (and in most cases disadvantages) for attaching porphyrins to Si. Nevertheless, the success of thermal attachment methods (both for porphyrins and other types of molecules) combined with the fact that porphyrins are known to be stable at very high temperatures (400° C. under inert atmosphere conditions) (Liu et al. (2003) *Science*, 302:

1543-1545) where other types of organic molecules decompose prompted us to explore very high temperature processing strategies.

Figure 11:
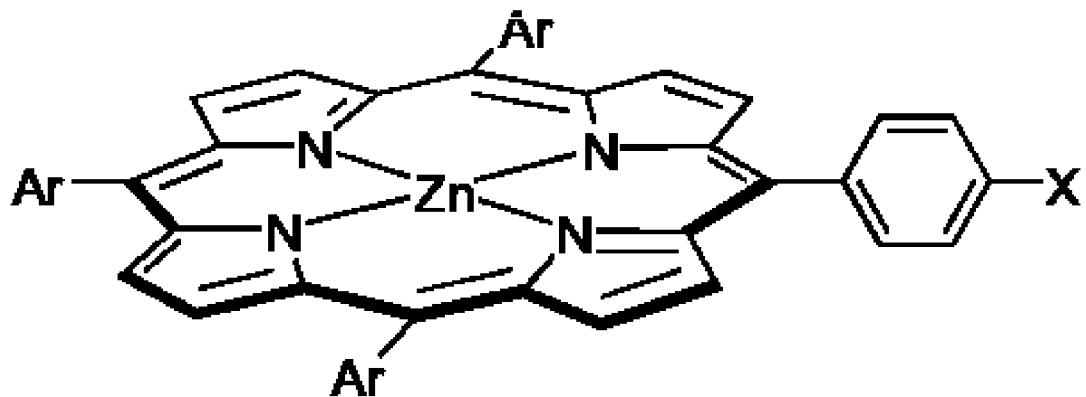
FIG. 11 illustrates porphyrins that have been attached via the high temperature process described herein. Ar consists of mesityl, p-tolyl, and/or phenyl groups.

In this example, we demonstrate that porphyrins containing a wide variety of aryl functional groups undergo rapid, facile attachment under high-temperature processing conditions. The structures of the various molecules successfully attached are shown in FIG. 11. The successful attachment via bromo, iodo, bromomethyl, formyl, S-acetylthiomethyl Se-acetylselenomethyl, and trimethylsilylethynyl groups is unprecedented. We further demonstrate that the high-temperature processing conditions afford attachment either by direct deposition of the sample onto the Si substrate or sublimation onto the Si substrate.

The initial high-temperature attachment procedure involved a direct deposition approach. In this procedure, the porphyrin was first dissolved in an organic solvent and a small drop (1 μL) of the resulting dilute solution was placed onto the micron-size silicon platform.

The 100 μm×100 μm Si platforms were prepared photolithographically from device-grade wafers (B-doped Si(100); $\rho$=0.005-0.1Ω cm). All materials, procedures, and techniques and instrumentation for conducting the electrochemical studies were as described in Roth et al. (2003) *Am. Chem. Soc.*, 125: 505-517. The surface coverage of the molecules was determined by integrating the peaks in the voltammogram. The temperature of the Si platform was measured by attaching a thermocouple directly to the platform.

Figure 12:
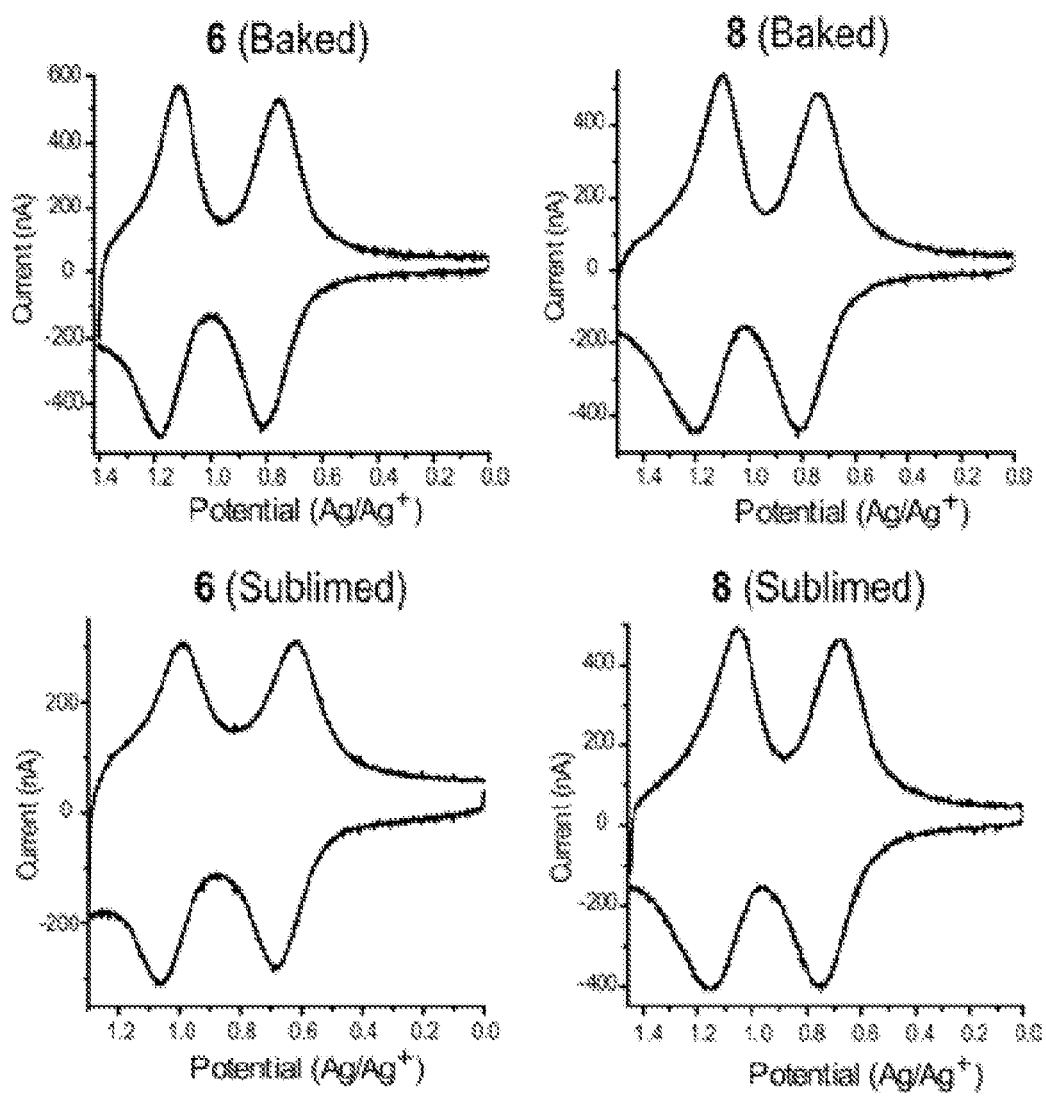
FIG. 12 shows fast-scan cyclic voltammograms ($100\,Vs^{-1}$) of monolayers of compounds 6 and 8 (see FIG. 11) on p-type Si(100) microelectrodes. The solvent/electrolyte overlayer is composed of propylene carbonate containing 1.0 M $Bu_4NPF_6$.

The platform was placed in a vial, which was sealed and purged with Ar. The vial was then placed on a hot plate preheated to a particular temperature and the system was "baked" for a specified time. The Si platform was then cooled, washed to remove non-attached porphyrin, and interrogated voltammetrically to investigate the quality of the monolayer and determine the surface coverage as described above. FIG. 12 (top panels) shows representative cyclic voltammograms of 6 and 8 obtained by attaching the porphyrins using a 100 μM deposition solution followed by baking at 400° C. for 2 min.

The "best" attachment conditions for direct deposition were determined via a systematic study that probed the effects of varying the baking temperature, the baking time, the concentration of the porphyrins in the deposition solution, and the nature of the deposition solvent. The first three of these variables are not independent; however, the studies revealed the following general trends: (1) As the baking temperature is increased, the surface coverage monotonically increases. For example, increasing the baking temperature from 100 to 400° C. (baking time 30 min; deposition solution porphyrin conc. 1 mM) increased the surface concentration from $1\times10^{-11}$ mol cm$^{-2}$ to $\sim8\times10^{-11}$ mol cm$^{-1}$ (the saturating coverage for the porphyrin is $\sim10^{-10}$ mol cm$^{-2}$). At temperatures above 400° C., no further attachment was achieved and the system degraded. (2) As the baking temperature is increased, the time required to achieve the highest surface coverage monotonically decreases. For example, a baking time of 1 h was required to achieve maximum coverage at 200° C. This time was reduced to 2 min when the baking temperature was elevated to 400° C. (3) As the concentration of the porphyrin in the deposition solution was increased from 1 μM to 100 μM, the surface coverage for a given baking time and temperature systematically increased. Increasing the porphyrin concentrations above 100 μM had little effect on the coverage. (4) Both high-boiling (benzonitrile, bp=191° C.) and low-boiling (THF, bp=66° C.) solvents yielded essentially identical results for a particular set of deposition and baking conditions.

The characteristic features of the voltammograms are indicative of covalent attachment and robust electrochemical behavior (Roth et al. (2003) *Am. Chem. Soc.*, 125: 505-517). Similar voltammetry was observed for the other molecules in FIG. 11 using the same deposition conditions. Attachment also was achieved with a number of porphyrins bearing a functional group (e.g., iodo, formyl, vinyl, ethynyl, allyl) directly appended to the porphyrin. As controls, the zinc chelates of various porphyrins that lack functional groups were examined. These molecules included octaethylporphyrin, meso-tetraphenylporphyrin, meso-tetra-p-tolylporphyrin, and meso-tetramesitylporphyrin. No attachment was observed for any of these porphyrins as was evident from the observation that the baked film was completely removed by washing (in addition, no voltammetric peaks were observed).

These results indicate that the high-temperature attachment procedure (1) has broad scope encompassing diverse functional groups, (2) tolerates a variety of arene substituents, and (3) does not afford indiscriminate attachment.

The next high-temperature attachment procedure involved an indirect deposition approach. In this procedure, a small quantity of the porphyrin (<1 mg) was placed in the bottom of a cylindrical glass container whose diameter permitted insertion into the heating vial. The top of the container was flat to allow the Si platform to be placed on top with the micron-size electrode facing inward (~3 mm above the solid sample). The vial was sealed, purged with Ar, placed on a hot plate preheated to a particular temperature, and the porphyrin was sublimed for a specified time. The Si platform was then cooled, washed to remove non-attached porphyrin, and interrogated voltammetrically to investigate the quality of the monolayer and determine the surface coverage. Representative cyclic voltammograms of 6 and 8 are shown in FIG. 12 (bottom panels). Both of these molecules were attached by subliming at 400° C. for 20 min.

The "best" attachment conditions for indirect deposition were determined via a systematic study that probed the effects of varying the sublimation temperature and baking time. At temperatures below 300° C., relatively little attachment was achieved via the sublimation method. At 400° C., the surface coverage monotonically increased as the sublimation time was increased. No further coverage was observed for times longer than 20 min.

The characteristic features of the voltammograms obtained via the sublimation method are quite similar to those obtained via the baking method. Similar results were obtained for the other molecules in FIG. 11.

Collectively, the studies reported herein indicate that porphyrins bearing a variety of functional groups can be covalently attached to Si via high-temperature processing. The method affords a nearly universal strategy for attaching porphyrins. The baking approach is essentially "dry" inasmuch as only a small amount of solvent is used in the attachment process; the sublimation approach is totally "dry" in that no solvents are required in the process. This latter process is particularly appealing from a semiconductor processing perspective, wherein uniform attachment of molecules to very large (30 cm) Si wafers might be anticipated in the manufacture of future-generation hybrid molecular/semiconductor devices.

Example 4

Attachment of Organic Molecules to Transition Metal Surfaces

Various redox molecules containing either alcohol or phosphonate tethers have been attached to sputtered W surfaces.

The surfaces underwent a heat treatment in an oxidizing ambient prior to attachment. The tungsten areas were defined through photolithography. The molecule solution for attachment was prepared by dissolving molecules in benzonitrile. The sample was kept in Ar$_2$ at a set temperature during the attachment process. After deposition, the samples were cleaned by sonicating in tetrahydrofuran. A solution of 1.0 M tetrabutylammonium hexafluorophosphate (TBAH) (Aldrich) in propylene carbonate (PC) (Aldrich, 99.7%) was used as the supporting electrolyte. The counter electrode was prepared by sonicating the silver wire in 7.0 M NH$_4$OH and rinsing it at deionized water and ethanol. The samples were measured by Cyclic voltammetry and indicated excellent behavior.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of coupling a redox-active molecule to a surface to form a self-assembled monolayer, said method comprising:
    heating a heat-resistant organic redox-active molecule bearing an attachment group and/or said surface to a temperature of at least about 100° C., wherein said redox active molecule is selected from the group consisting of a porphyrin, a porphyrinic macrocycle, an expanded porphyrin, a contracted porphyrin, a linear porphyrin polymer, a porphyrinic sandwich coordination complex, and a porphyrin array; and
    contacting said molecule in a gas phase to said surface whereby said molecule couples to said surface forming said monolayer, and where the attached molecule remains stable and can sustain setting and resetting of its oxidation state through thousands of cycles.

2. The method of claim 1, wherein said organic molecule is electrically coupled to said surface.

3. The method of claim 1, wherein said heating is under an inert atmosphere.

4. The method of claim 1, wherein said heating comprises heating said molecule to a gas phase.

5. The method of claim 1, wherein said heating comprises heating said molecule and/or said surface while said molecule is in contact with said surface.

6. The method of claim 1, wherein said heating comprises applying said molecule to said surface and then simultaneously or subsequently heating the molecule and/or surface.

7. The method of claim 1, wherein said heating said molecule comprises heating said molecule to a temperature of at least about 200° C.

8. The method of claim 1, wherein said heating said molecule comprises heating said molecule to a temperature of at least about 300° C.

9. The method of claim 1, wherein said heating said molecule comprises heating said molecule to a temperature of at least about 400° C.

10. The method of any of claims 1 through 9, wherein said molecule couples to said surface via a covalent linkage.

11. The method of claim 1, wherein said heating occurs in a CVD device.

12. The method of claim 1, wherein said heating occurs in an MBE device.

13. The method of claim 1, wherein said surface comprises a material selected from the group consisting of a Group III element, a Group IV element, a Group V element, a semiconductor comprising a Group III element, a semiconductor comprising a Group IV element, a semiconductor comprising a Group V element, a transition metal, and a transition metal oxide.

14. The method of claim 13, wherein said Group III, IV, or V element is a Group IV element or a doped Group IV element.

15. The method of claim 14, wherein said Group III, IV, or V element is selected from the group consisting of silicon, germanium, doped silicon, and doped germanium.

16. The method of claim 1, wherein said surface comprises a transition metal or an oxide of a transition metal selected from the group consisting of tungsten, tantalum, and niobium.

17. The method of claim 1, wherein said surface comprises an element, alloy, oxide or nitride of a metal selected from the group consisting of Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, and Mo.

18. The method of claim 1, wherein said surface comprises a metal selected from the group consisting of Ga, Au, Ag, Cu, Al, Ta, Ti, Ru, Ir, Pt, Pd, Os, Mn, Hf, 20 Zr, V, Nb, La, Y, Gd, Sr, Ba, Cs, Cr, Co, Ni, Zn, Ga, In, Cd, Rh, Re, W, and Mo.

19. The method of claim 1, wherein said surface is a hydrogen passivated surface.

20. The method of claim 1, wherein said redox-active molecule comprises a porphyrinic macrocycle substituted at a β-position or at a meso-position.

21. The method of claim 1, wherein said redox-active molecule comprises a porphyrinic macrocycle containing at least two porphyrins of equal energies held apart from each other at a spacing less than about 50 Å such that said molecule has an even or an odd hole oxidation where the hole hops between said two porphyrins, and wherein said odd hole oxidation state is different from and distinguishable from another oxidation state of said porphyrinic macrocycle.

22. The method of claim 1, wherein said attachment group comprises an aryl functional group.

23. The method of claim 22, wherein said aryl functional group comprises a functional group selected from the group consisting of bromo, iodo, hydroxy, hydroxymethyl, formyl, bromomethyl, vinyl, allyl, S-acetylthiomethyl, Seacetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl.

24. The method of claim 1, wherein said attachment group comprises an alkyl functional group.

25. The method of claim 24, wherein said alkyl attachment group comprises a functional group selected from the group consisting of bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl.

26. The method of claim 1, wherein said attachment group comprises an alcohol or a phosphonate.

27. The method of claim 1, wherein said attachment group is selected from the group consisting of 4-(hydroxymethyl)phenyl, 4-(S-acetylthiomethyl)phenyl, 4-(Se-acetylselenomethyl)phenyl, 4-(mercaptomethyl)phenyl, 4-(hydroselenomethyl)phenyl, 4-formylphenyl, 4-(bromomethyl)phenyl, 4-vinylphenyl, 4-ethynylphenyl, 4-allylphenyl, 4-[2-(trimethylsilyl)ethynyl]phenyl, 4[2-(triisopropylsilyl)ethynyl]phenyl, 4-bromophenyl, 4-iodophenyl, 4-hydroxyphenyl, 4-(4,4,5,5-tetramethyl-1,3,2-dioxaborolan-2-yl)phenyl bromo, iodo, hydroxymethyl, S-acetylthiomethyl, Se-acetylselenomethyl, mercaptomethyl, hydroselenomethyl, formyl, bromomethyl, chloromethyl, ethynyl, vinyl, allyl, 44244-(hydroxymethyl)phenyl)ethynyl]phenyl, 4-(ethynyl) biphen-4'-yl, 4-[2-(triisopropylsilyl)ethynyl]biphen-4'-yl, 3,5-diethynylphenyl, and 2-bromoethyl.

28. The method of claim 1, wherein said heat-resistant organic molecule bearing an attachment group is selected from the group consisting of 5-[4-(S-acetylthiomethyl)phenyl]-10,15,20-trimesitylporphinatozinc(II), 5-[4-(mercaptomethyl)phenyl]-10,15,20-trimesitylporphinatozinc(II), 5-[4-(hydroxymethyl)phenyl]-10,15,20-trimesitylporphinatozinc(II), 5-(4-(hydroxymethyl)phenyl]-10,15,20-tri-p-tolylporphinatozinc(II), 5-(4-allylphenyl)-10,15,20-trimesitylporphinatozinc(II), 5-(4-formylphenyl)-15-phenyl-10,20-di-p-tolylporphinatozinc(II), 5-(4-bromomethylphenyl)-10,15,20-trimesitylporphinatozinc(II), 5-(4-ethynylphenyl)-10,15,20-trimesitylporphinatozinc(II), 544-iodophenyl)-10,15,20-trimesitylporphinatozinc(II), 5-(4-bromophenyl)-10,15,20-tri-p-tolylporphinatozinc(II), 5-(4-hydroxyphenyl)-10,15,20-trimesitylporphinatozinc(II), 5,10-bis(4-ethynylphenyl)-15,20-dimesitylporphinatozinc(II), 5-[4-(4,4,5,5-tetramethyl-1,3,2-dioxaborolan-2-yl)phenyl]-10,20-bis(3,5-di-tert-butylphenyl)-15-mesitylporphinatozinc(II), 5-iodo-10,20-bis(3,5-di-tert-butylphenyl)-15-mesitylporphinatozinc(II), 5,10-bis(4-iodophenyl)-15,20-dimesitylporphinatozinc(II), 5-[4-(2-(trimethylsilyl)ethynyl)phenyl]-10,15,20-trimesitylporphinatozinc(II), 5,15-bis(4-ethynylphenyl)-10,20-dimesitylporphinatozinc(II), 5,15-bis(4-iodophenyl)-10,20-dimesitylporphinatozinc(II), 5,10,15-tris(4-ethynylphenyl)-20-mesitylporphinatozinc(II), 5,15-bis(4-ethynylphenyl)-10,20-bis(4-tert-butylphenyl) porphinatozinc(II), 5,15-bis(4-ethynylphenyl) porphinatozinc(II), 5,15-bis(3-ethynylphenyl)-10,20-dimesitylporphinatozinc(II), 5,10,15,20-tetrakis(4-ethynylphenyl)porphinatozinc(II), 5,10-bis[4-(2-(trimethylsilyl)ethynyl)phenyl]-15,20-dimesitylporphinatozinc(II), 5-(3,5-diethynylphenyl)-10,15,20-trimesitylporphinatozinc(II), 3,7-dibromo-10,20-bis(3,5-di-tert-butylphenyl)-15-mesitylporphinatozinc(II), 5-[4-(2-(trimethylsilyl)ethynyl)phenyl]-10,15,20-tri-p-tolylporphinatozinc(II), 5-[4-(Se-acetylselenomethyl) phenyl]-10,15,20-trimesitylporphinatozinc(II), 5-(4-iodophenyl)-10,20-bis(3,5-di-tert-butylphenyl)-15-mesitylporphinatozinc(II), 5,10-bis(4-ethynylphenyl)-15,20-bis(4-tert-butylphenyl)porphinatozinc(II), 5,10-bis(4-ethynylbiphen-4-yl)-15,20-bis(4-tert-butylphenyl) porphinatozinc(II), 5-(4-vinylphenyl)-10,15,20-trimesitylporphinatozinc(II), 5-(4-vinylphenyl)-10,15,20-tri-p-tolylporphinatozinc(II), 5-(hydroxymethyl)-10,15,20-trimesitylporphinatozinc(II), 5-(4-allylphenyl)-10,15,20-tri-p-tolylporphinatozinc(II), 5-(4-allylphenyl)-10,15,20-tri-p-tolylporphinatocopper(II), type c triple decker [(tert-butyl)$_4$phthalocyaninato]Eu[(tert-butyl)$_4$phthalocyaninato]Eu[5,15-bis(4-ethynylphenyl)-10,20-bis(4-tert-butylphenyl)porphyrin], type c triple decker [(tert-butyl)$_4$phthalocyaninato]Eu[(tert-butyl)$_4$phthalocyaninato]Eu[5-[4-[2-(4-(hydroxymethyl)phenyl)ethynyl]phenyl]-10,15,20-tri-p-tolylporphyrin], 5,10-bis[4-(2-(triisopropylsilyl)ethynyl)biphen-4-yl]-15,20-bis(4-tert-butylphenyl)porphinatozinc (II), and 5,10-bis[4-(2-(triisopropylsilyl)ethynyl)phenyl]-15,20-bis(4-tert-butylphenyl)porphinatozinc(II).

29. The method of claim 1, wherein said contacting comprises selectively contacting the organic molecule to certain regions of said surface and not to other regions.

30. The method of claim 29, wherein said contacting comprises:
placing a protective coating on said surface in regions where said organic molecule is not to be attached;
contacting said molecule with the surface; and removing the protective coating to provide regions of the surface without said organic molecule.

31. The method of claim 29, wherein said contacting comprises contacting said surface with said molecule and subsequently etching selected regions of said surface to remove said organic molecule.

32. The method of claim 1, wherein said contacting comprises selectively contacting the volatilized organic molecule to certain regions of said surface and not to other regions.

33. The method of claim 1, wherein said contacting comprises plasma-assisted vapor deposition.

34. The method of claim 1, wherein said contacting comprises sputtering.

35. The method of claim 1, wherein said heat-resistant organic molecule comprises a mixture at least two different species of heat-resistant organic molecule.

* * * * *